(12) United States Patent
Akutagawa et al.

(10) Patent No.: US 7,638,367 B2
(45) Date of Patent: Dec. 29, 2009

(54) METHOD OF RESIN SEALING ELECTRONIC PART

(75) Inventors: Yoshito Akutagawa, Kawasaki (JP);
Izumi Kobayashi, Kawasaki (JP);
Naoyuki Watanabe, Kawasaki (JP);
Susumu Moriya, Kawasaki (JP);
Toshiyuki Honda, Kawasaki (JP);
Noboru Hayasaka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 206 days.

(21) Appl. No.: 11/483,593

(22) Filed: Jul. 11, 2006

(65) Prior Publication Data
US 2007/0196957 A1    Aug. 23, 2007

(30) Foreign Application Priority Data
Feb. 17, 2006    (JP)    ............... 2006-041026

(51) Int. Cl.
*H01L 21/00* (2006.01)
(52) U.S. Cl. ............... 438/126; 257/E21.499
(58) Field of Classification Search ............ 438/106, 438/112, 120, 124–127; 257/E23.116, E21.499
See application file for complete search history.

(56) References Cited

U.S. PATENT DOCUMENTS 7,056,770 B2    6/2006    Uragami et al.

2004/0048416 A1 *    3/2004    Takase ............... 438/106
2006/0078246 A1 *    4/2006    Ashida ............... 385/14

FOREIGN PATENT DOCUMENTS

| CN | 1503339 A | | 6/2004 |
|---|---|---|---|
| JP | 5-243301 A | | 9/1993 |
| JP | 2002-137250 A | | 5/2002 |
| JP | 2004179284 A | * | 6/2004 |
| JP | 2004-216558 A | | 8/2004 |
| JP | 2004230707 A | * | 8/2004 |

OTHER PUBLICATIONS

Chinese Office Action dated Mar. 7, 2008, issued in corresponding Chinese Patent Application No. 200610107503 and English translation.

* cited by examiner

*Primary Examiner*—Brook Kebede
(74) *Attorney, Agent, or Firm*—Fujitsu Patent Center

(57) ABSTRACT

A method of resin sealing an electronic part, includes the steps of: providing a board where one or more of the electronic parts are mounted in an upper mold; melting a resin material received in a cavity forming part of a lower mold; and dipping the electronic part held by the upper mold into the molten resin so that the resin sealing is achieved. The resin material is received in the cavity forming part of the lower mold after the resin material is pressurized and dispersed in a sealing resin supply apparatus.

10 Claims, 25 Drawing Sheets

METHOD OF RESIN SEALING ELECTRONIC PART

BACKGROUND OF THE INVENTION

1. Field of the Invention

The present invention generally relates to method of resin sealing electronic parts, and more specifically, to a method of resin sealing an electronic part, the method having a step of resin sealing the semiconductor element and a bonding wire connected to an electrode such as an outside connection terminal of the semiconductor element.

2. Description of the Related Art

As today's electronic apparatuses have high function or high operability, it is required that the semiconductor devices applied to the electronic apparatuses also have high functionality or high operability.

Because of this, in a semiconductor element of the semiconductor device, especially in a large scale integrated circuit, plural functional circuits are received, and an active element such as a transistor forming the functional circuit block, a passive element such as resistance element, and a wiring are made minute and highly integrated.

Since the semiconductor element includes plural functional blocks, the semiconductor element requires a large number of outside connection terminals. Therefore, a gap or pitch between the outside connection terminals is further shortened. Because of this, a smaller diameter is applied to a bonding wire connecting to an outside connection terminal of the semiconductor element.

In addition, it is required that an electrode terminal on a supporting body such as the wiring board have a small size or high density. However, there is a limitation to making the electrode terminal have the small size or high density. Therefore, it may be difficult to provide the electrode terminal closer to the semiconductor element. Because of this, there is a tendency that the length of the bonding wire connecting the electrode terminal on the supporting body and the outside connection terminal of the semiconductor element is long.

Meanwhile, a resin sealing method as one of known sealing methods is applied when the semiconductor device is formed by sealing the semiconductor element and the bonding wire. As the resin sealing method, a transfer molding method has been conventionally used.

In the transfer molding method, the supporting body such as the wiring board or a lead frame, the semiconductor element mounted on the semiconductor element, a bonding wire connecting the outside connection terminal of the semiconductor element and the electrode terminal on the wiring board or the lead frame, and others are arranged in a mold. The sealing resin is pushed into the mold so that resin sealing is implemented. See Japanese Patent Application Publication No. 5-243301.

However, in such a transfer molding method, since the sealing resin is pushed into the mold at high pressure, the following problem may happen. That is, in a case where the diameter of the bonding wire is small or the length of the bonding wire is long, deformation and/or breaking of the bonding wire due to a flow of the sealing resin may happen and a short circuit with another bonding wire may be generated.

Because of this, instead of the transferring mold method, a compression molding method is disclosed.

In such a compression molding method, a resin sealed body, the resin sealed body including the supporting body such as the wiring board or a lead frame, the semiconductor element mounted on the semiconductor element, a bonding wire connecting the outside connection terminal of the semiconductor element and the electrode terminal on the wiring board or the lead frame, and others, is arranged in the upper mold. Powder or granular sealing resin is received in a cavity formed in the lower mold. The resin is heated so as to become molten. In this state, by closing the upper mold and lower mold, the resin sealed body is dipped in molten resin so that resin sealing is achieved.

According to such a compression molding method, since pushing the sealing resin into the mold is not implemented, there is little chance that the deformation and/or breaking of the bonding wire due to the flow of the sealing resin will happen.

Japanese Patent Application Publication No. 2002-137250 discloses a structure where a stick-shaped adjusting member is built in a metering part, to which metering part granules in a hopper are supplied in a such a way that the stick-shaped adjusting member can be freely squeezed into a metering hole, and the amount of the granules supplied is adjusted by controlling the amount of the adjusting member there is squeezed into the metering hole. Japanese Patent Application Publication No. 2004-216558 discloses a method whereby uniformly pressed granular resin is supplied to a mold cavity forming part almost simultaneously with sliding and opening of an on-off part in a resin supply mechanism in a horizontal direction so that the granular resin is uniformly pressed by pressure means at the time of opening the mold.

However, in the above-mentioned compression molding method, a flow of the sealing resin may be generated at the time when the sealing resin is molten due to the distribution of the sealing resin in the cavity formed in the lower mold. As a result of this, the deformation and/or breaking of the bonding wire due to the flow of the sealing resin may happen.

This problem is discussed below with reference to FIG. 1 through FIG. 7.

Here, FIG. 1 is a first view for explaining problems of a related art compression molding method. FIG. 2 is a second view for explaining problems of the related art compression molding method.

Referring to FIG. 1 and FIG. 2, a sealing resin receiving part 3 surrounded by a wall part 2 is provided in a substantially center of an upper surface of a sealing resin supply apparatus 1. In addition, bottom plates 4-1 and 4-2 are provided at a lower part of the sealing resin receiving part 3. The bottom plates 4-1 and 4-2 are opened and closed by being reciprocated in a horizontal direction.

A designated amount of powder or granular sealing resin is received in the entirety of the sealing resin receiving part 3 so that the thickness of the sealing resin in the sealing resin receiving part 3 is substantially uniform. Such a sealing resin supply apparatus 1 is provided above a lower mold 7 as shown in FIG. 3.

As shown in FIG. 3, a cavity forming part 10 is formed in a center part of an upper surface of the lower mold 7. The cavity forming part 10 is surrounded by a frame part 8 elastically supported by a spring 11. A release film 9 covers a bottom surface of the cavity forming part 10 and a surface of the frame part 8.

The bottom plate 4-1 provided at the sealing resin receiving part 3 is slid in a left direction and the bottom plate 4-2 provided at the sealing resin receiving part 3 is slid in a right direction as shown by arrows S1 in FIG. 3, so that the sealing resin 5 received in the sealing resin receiving part 3 falls into the cavity forming part 10 of the lower mold 7. The lower mold 7 is heated at, for example 175° C. Because of this, the sealing resin 5 received in the cavity forming part 10 is melted.

According to the method of supplying the sealing resin 5 to the mold, since the bottom surface of the sealing resin receiving part 3 is opened by sliding the bottom plates 4-1 and 4-2, as shown in FIG. 4, the sealing resin 5 that has fallen down into the cavity forming part 10 of the lower mold 7 is piled up and the piled amount of the resin 5 near the area of the frame part 8 in the cavity forming part 10 is large so that the distribution of the sealing resin 5 in the cavity forming part 10 may be non-uniform.

After the sealing resin 5 is supplied into the cavity forming part 10 of the lower mold 7, the sealing resin supply apparatus 1 is removed from the upper part of the lower mold 7. The lower mold 7 immediately moves (is raised) in a direction shown by an arrow S2 so that the lower mold 7 and the upper mold 15 are mold closed.

In the upper mold 15, a body to be resin sealed is held by a clamp part 16 and vacuum suction via a vacuum suction hole 17. Here, the body has a structure where plural semiconductor elements 22 are mounted on and fixed to a main surface of a single wiring board 21 and an outside connection terminal of the semiconductor element 22 and an electrode terminal on the wiring board 21 are connected by the bonding wire 23. The wiring board 21 is arranged and held at the upper mold 15.

At the time of mold closing, the sealing resin 5 may flow from the vicinity of the frame part 8 to the center part in the cavity 10 of the lower mold 7, as shown by arrows S3 in FIG. 5. Because of this, if the semiconductor element 22, the bonding wire 23, and others held by the upper mold 15 are dipped into the sealing resin 5, the deformation and/or breaking of the bonding wire due to the flow of the sealing resin 5 may happen.

In FIG. 5, for explanation of the flow of the sealing resin 5, a state where the upper mold 15 and the lower mold 7 are separated is shown.

In addition, after the sealing resin 5 is distributed in the cavity forming part 10 so that the thickness of the sealing resin 5 is uniform, when the lower mold 7 moves in a direction shown by an arrow S2 in FIG. 6 for mold closing of the upper mold 15 and the lower mold 7, and the resin sealed body held by the upper mold 15 is dipped in the sealing resin 5, a flow of the sealing resin 5 in directions shown by arrows S4 in FIG. 6 may be generated due to an action of the semiconductor element 22 pushing and dividing the sealing resin 5.

Due to such a flow of the sealing resin 5, the deformation and/or breaking of the bonding wire 23 may happen.

In the resin sealed body, as shown in FIG. 7, the semiconductor element 22 may not be mounted on a part of the wiring board 21.

As a result of this, in a case where an arrangement of the semiconductor element 22 in the cavity forming part 10 is not uniform, as shown by arrows S5, a flow of the sealing resin 5 to a space where a semiconductor element 22 is not arranged may be generated. In such a case, the deformation and/or breaking of the bonding wire 23 may happen.

SUMMARY OF THE INVENTION

Accordingly, embodiments of the present invention may provide a novel and useful resin sealing method for an electronic part solving one or more of the problems discussed above.

More specifically, the embodiments of the present invention may provide a resin sealing method for an electronic part whereby deformation and/or breaking of a bonding wire due to a flow of sealing resin and contact of the bonding wire with another bonding wire can be prevented.

One aspect of the present invention may be to provide a method of resin sealing an electronic part, including the steps of: providing a board where one or more of the electronic parts are mounted in an upper mold; melting a resin material received in a cavity forming part of a lower mold; and dipping the electronic part held by the upper mold into the molten resin so that the resin sealing is achieved; wherein the resin material is received in the cavity forming part of the lower mold after the resin material is pressurized and dispersed in a sealing resin supply apparatus.

It may be also the aspect of the present invention to provide a method of resin sealing an electronic part, including the steps of: providing a board where one or more of the electronic parts are mounted in an upper mold; melting a resin material received in a cavity forming part of a lower mold; and dipping the electronic parts held by the upper mold into the molten resin so that the resin sealing is achieved; wherein the resin material is received in the cavity forming part of the lower mold, after a concave part having a volume corresponding to the volume of the electronic part is formed in a position of the resin material corresponding to the mounting position of the electronic parts and then the resin material is made solid.

It may be also the aspect of the present invention to provide a method of resin sealing an electronic part, including the steps of: providing a board where one or more of the electronic parts are mounted in an upper mold; melting a resin material received in a cavity forming parts of a lower mold; and dipping the electronic part held by the upper mold into the molten resin so that the resin sealing is achieved; wherein a projection part having a volume same as a volume of the electronic part mounted on the board is provided in the cavity forming part of the lower mold so as to be capable of selectively projecting as corresponding to the existence of the electronic parts; the resin material is received and made molten in the cavity forming part of the lower mold; and a projection amount of the projection is reduced as corresponding to dipping of the electronic parts into the molten resin.

According to the embodiments of the present invention, it is possible to provide the method of resin sealing the electronic part whereby deformation and/or breaking of the bonding wire due to the flow of the sealing resin and contact of the bonding wire with another bonding wire can be prevented.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 8 through FIG. 35 of embodiments of the present invention.

In the following explanation, a semiconductor device, a semiconductor element mounted on and fixed to a wiring board, and a bonding wire connecting an outside connection terminal of the semiconductor device and an electrode pad provided on the wiring board are discussed as an example of an electronic part.

First Embodiment

A method of resin sealing an electronic part of a first embodiment of the present invention is discussed with reference to FIG. 8 through FIG. 15.

Figure 1:
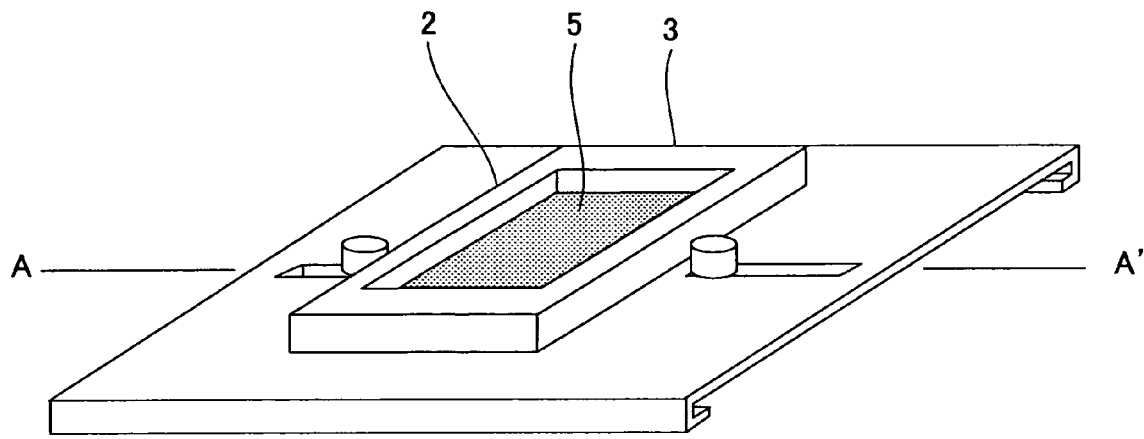
FIG. 1 is a first view for explaining problems of a related art compression molding method.
Figure 2:
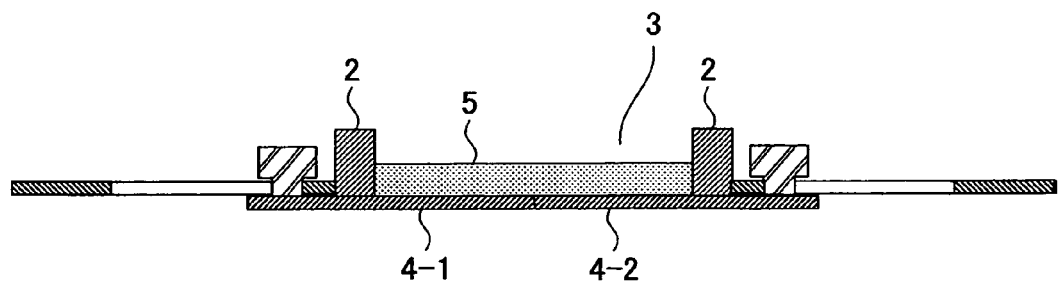
FIG. 2 is a second view for explaining problems of the related art compression molding method.
Figure 3:
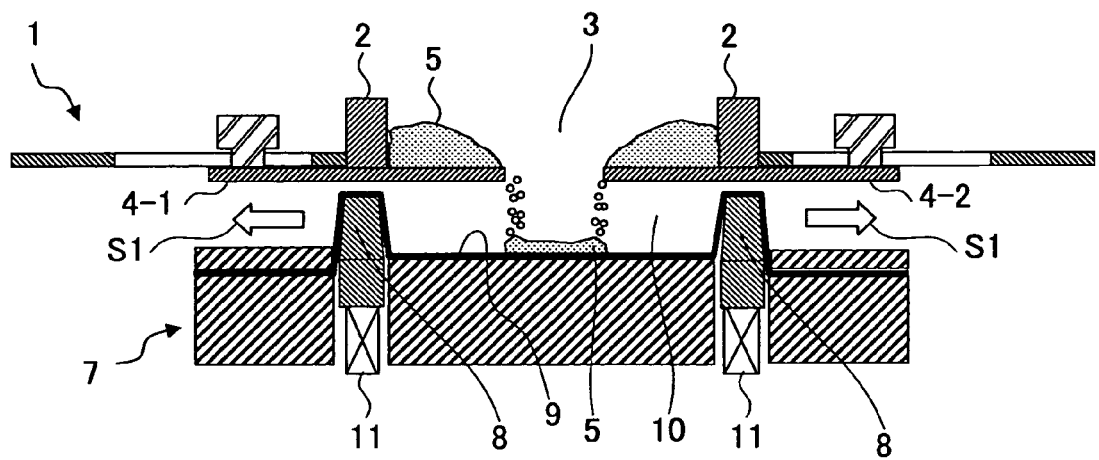
FIG. 3 is a third view for explaining problems of the related art compression molding method.
Figure 4:
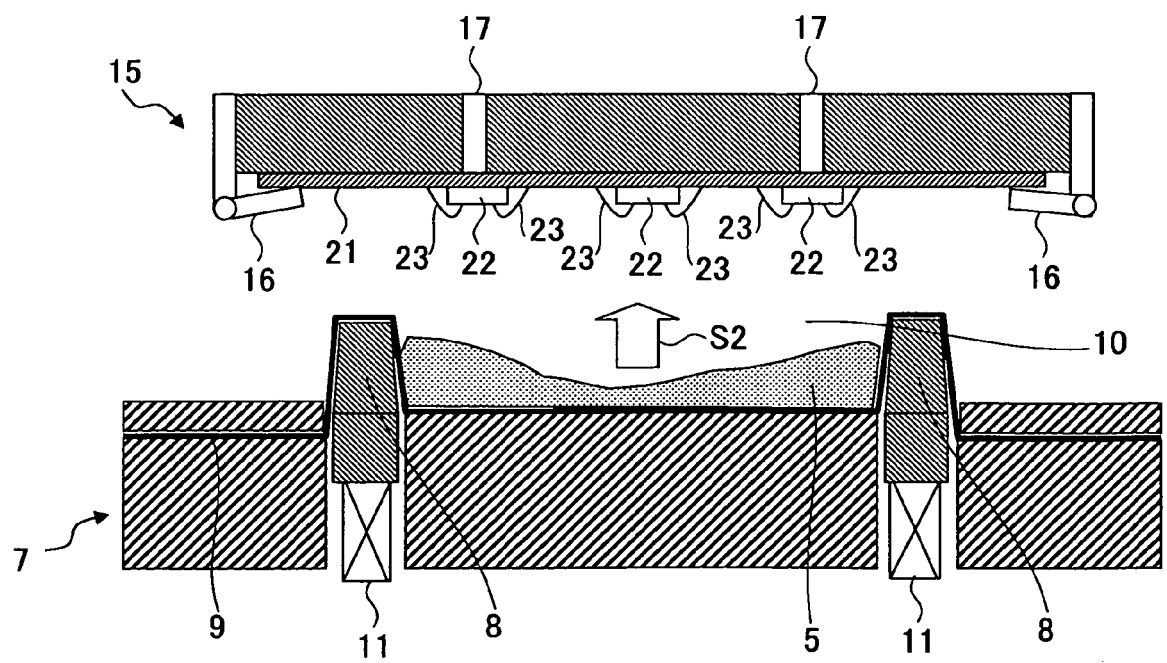
FIG. 4 is a fourth view for explaining problems of the related art compression molding method.
Figure 5:
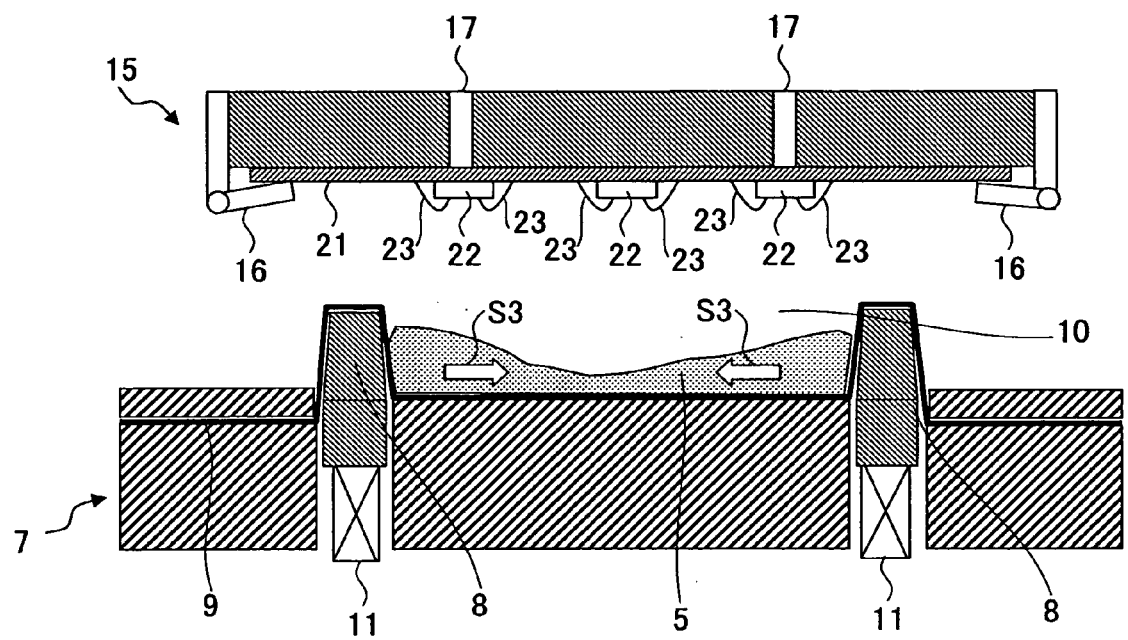
FIG. 5 is a fifth view for explaining problems of the related art compression molding method.
Figure 6:
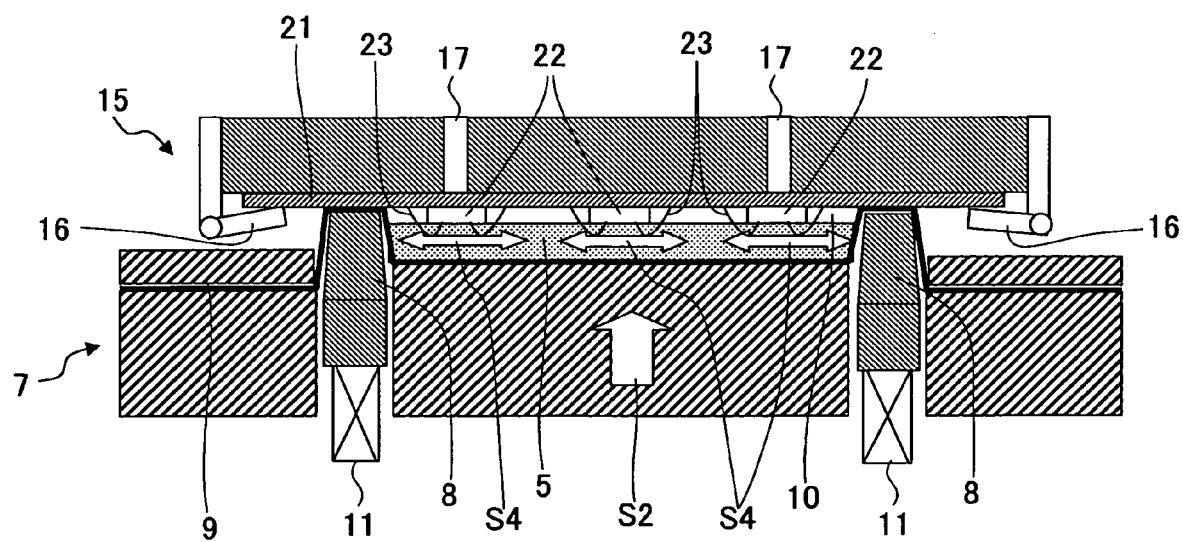
FIG. 6 is a sixth view for explaining problems of the related art compression molding method.
Figure 7:
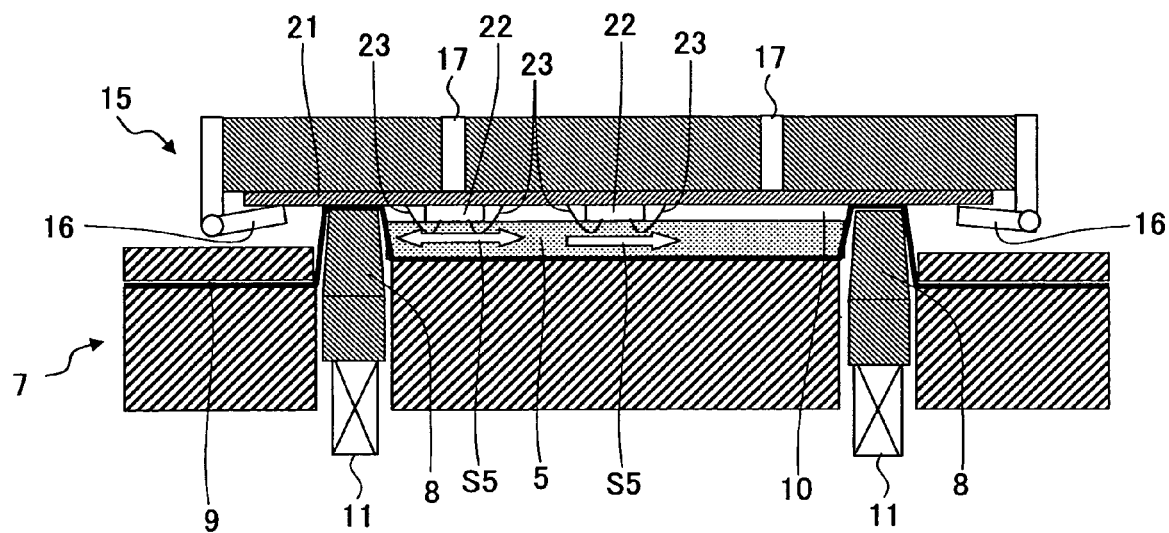
FIG. 7 is a seventh view for explaining problems of the related art compression molding method.
Figure 8:
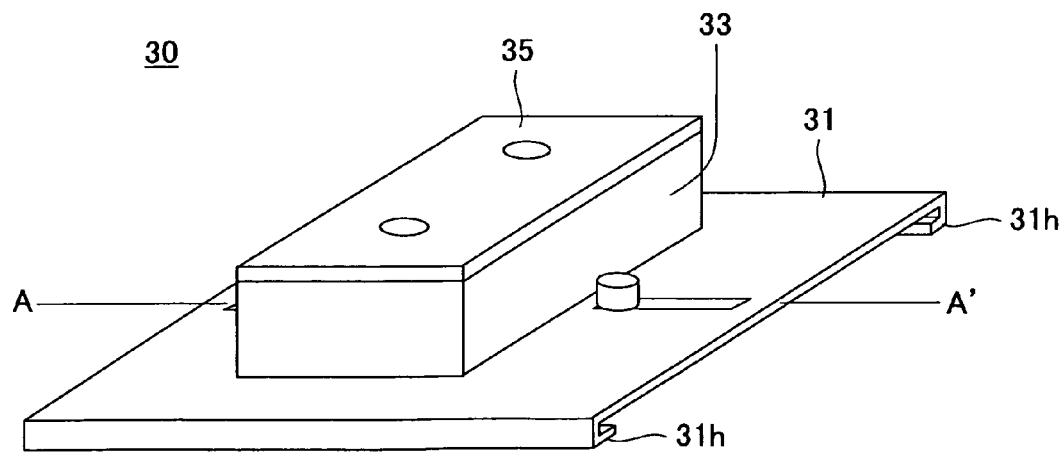
FIG. 8 is a schematic perspective view of a sealing resin supply apparatus of a first embodiment of the present invention.
Figure 9:
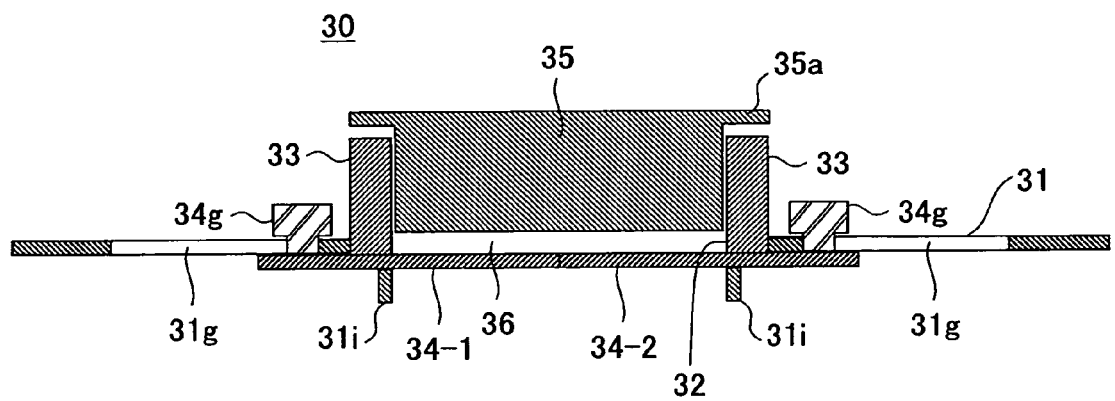
FIG. 9 is a first cross-sectional view taken along a line A-A' of FIG. 8.

An external appearance of a sealing resin supply apparatus 30 used in a method of resin sealing an electronic part of a first embodiment of the present invention is shown in FIG. 8. FIG. 9 is a cross-sectional view taken along a line A-A' in FIG. 8.

The sealing resin supply apparatus 30 is made of a metal body having a relatively light weight such as aluminum (Al), An opening 32 is provided in the center of a plate-shaped board 31 made of aluminum (Al). Wall parts 33 are provided on a main upper surface of the board 31 so as to correspond to the periphery of the opening 32. In addition, bottom plates 34-1 and 34-2 are slidably provided at a lower main surface of the board 31 so that the opening 32 can be opened and closed.

In addition, a lid member 35 is provided so as to cover and engage an area defined by the wall parts 33.

Under this structure, as shown in FIG. 9, a space formed by the wall parts 33 and the bottom plates 34-1 and 34-2 forms a sealing resin receiving part 36.

A plan view configuration and measurement of the opening 32 corresponds to a configuration and measurement of a cavity forming part of a lower mold of a resin sealing apparatus discussed below.

The bottom plates 34-1 and 34-2 can be moved along guide holes 31g provided at the board 31 by guide pins 34g provided in the vicinities of outside edge parts of the bottom plates 34-1 and 34-2. In addition, a rectangle without one side part 31h is provided at both end parts in a width direction of the bottom plates 34-1 and 34-2, namely in a direction perpendicular to sliding directions of the bottom plates 34-1 and 34-2, and at a lower surface end part of the board 31. The bottom plates 34-1 and 34-2 are supported by the rectangle without one side part 31h so as to be slid.

Furthermore, support and guide parts 31i of the bottom plates 34-1 and 34-2 are provided on the lower main surface of the board 31 so as to correspond to the opening 32. The support and guide parts 31i have continuous wall shapes corresponding to the configuration and measurement of the cavity forming part of the lower mold of the resin sealing apparatus. The support and guide parts 31i support sliding of the bottom plates 34-1 and 34-2 and form guide parts when the sealing resin is supplied to the cavity forming part. For supporting and sliding the bottom plates 34-1 and 34-2, an opening (slit) corresponding to thicknesses of the bottom plates 34-1 and 34-2 is formed.

In addition, the lid member 35 presses the sealing resin received in the sealing resin receiving part 36. The lid member 35 has a great thickness and great weight. An external measurement of the lid member 35 is selected so that the lid member 35 can be easily moved in upper and lower directions along an internal side surface of the wall part 33. A lower surface, which surface faces the sealing resin receiving part 36, of the lid member 35 has an even plane surface. The lid member 35 is supported by an upper surface of the wall part 33 and a peak-shaped supporting plate 35a provided at an upper part of the side surface of the lid member 35. Under this structure, falling of the lid member 35 into the opening 32 is prevented.

The powder or granular sealing resin metered by a sealing resin metering part is received in the sealing resin receiving part 36.

Figure 10:
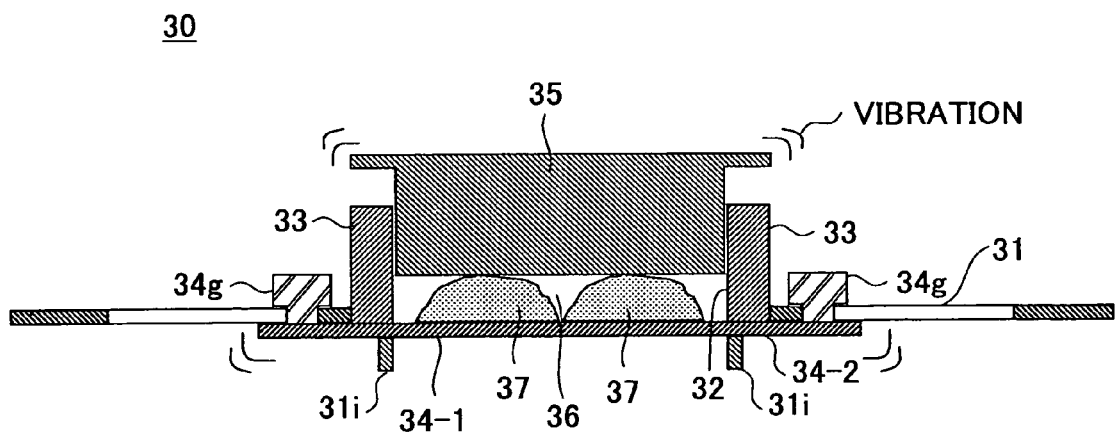
FIG. 10 is a second cross-sectional view taken along a line A-A' of FIG. 8.

A state where the sealing resin receiving part 36 receives the sealing resin 37 and the lid member 35 is provided in the sealing resin receiving part 36 is shown in FIG. 10.

As shown in FIG. 10, in the sealing resin receiving part 36, the sealing resin 37 does not have uniform thickness, and uniform distribution of the resin 37 against the opening 32 is not provided.

In this embodiment, in order to make the distribution of the sealing resin 37 in the sealing resin supply apparatus 30 uniform, a load is applied to the sealing resin 37 by using the own weight of the lid member 35 and the sealing resin supply apparatus 30 is vibrated in a horizontal direction.

A mechanism vibrating the sealing resin supply apparatus 30 in the horizontal direction is discussed with reference to FIG. 11 and FIG. 12.

Figure 11:
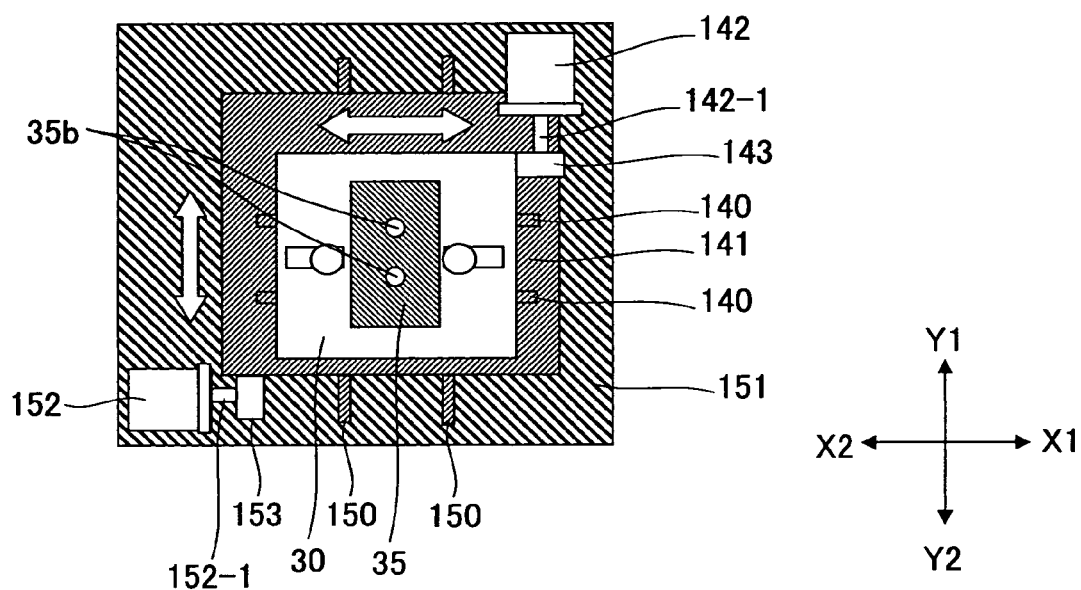
FIG. 11 is a view for explaining a mechanism for vibrating the sealing resin supply apparatus of the first embodiment of the present invention.

FIG. 11 is a view for explaining a mechanism for vibrating the sealing resin supply apparatus 30 of the first embodiment of the present invention.

Here, the sealing resin supply apparatus 30 is supported on an X direction moving stage 141 having an upper surface where two X direction moving stage rails 140 are provided in parallel.

The X direction moving stage 141 is provided on a Y direction moving stage 151 the stage 151 having an upper surface where two Y direction moving stage rails 150 are provided in parallel.

Under this structure, the sealing resin supply apparatus 30 can be moved in X1-X2 directions by driving an X direction moving stage motor 142. The X direction moving stage 141 supporting the sealing resin supply apparatus 30 can be moved in Y1-Y2 directions by driving a Y direction moving stage motor 152.

In FIG. 11, piercing holes 35b are provided in the lid member 35 so as to allow air in the sealing rein receiving part 36 to escape.

Next, a relationship between driving the X direction moving stage motor 142 and the Y direction moving stage motor 152, and movement of the sealing resin supply apparatus 30 and the X direction moving stage 141 is discussed with reference to FIG. 12.

A decentering cam 143 is provided at a rotational shaft 142-1 of the X direction moving stage motor 142. The decentering cam 143 comes in contact with the sealing resin supply apparatus 30. On the other hand, a decentering cam 153 is provided at a rotational shaft 152-1 of the Y direction moving stage motor 152. The decentering cam 153 comes in contact with the X direction moving stage 141.

Although not illustrated in FIG. 11, the sealing resin supply apparatus 30 is provided on the X direction moving stage 141 in a rotational shaft direction of the X direction moving stage motor 142. On the other hand, a pressing part is provided in the Y direction moving stage 151. The pressing part presses the X direction moving stage 141 in the rotational shaft direction of the Y direction moving stage motor 152.

Figure 12:
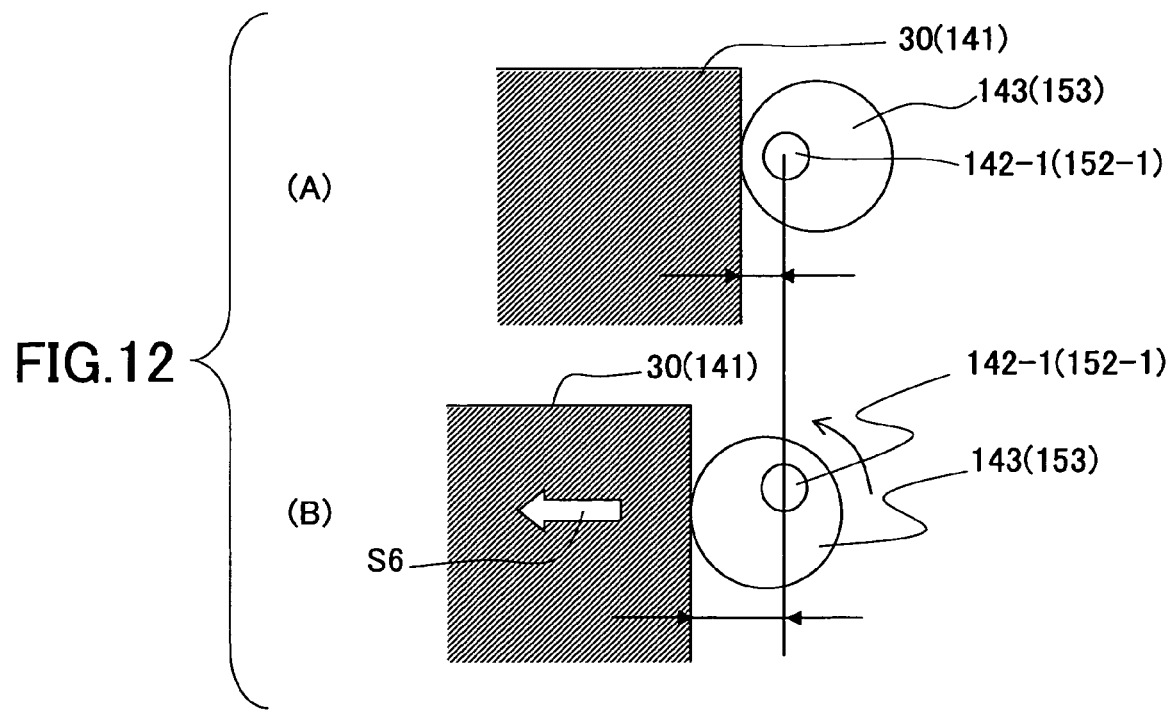
FIG. 12 is a schematic view showing movement of the sealing resin supply apparatus (an X direction moving stage) driven by an X direction moving stage motor (a Y direction moving stage motor)

Therefore, if the X direction moving stage motor 142 is driven so that the rotational shaft 142-1 is rotated from a position shown in FIG. 12-(A), the sealing resin supply apparatus 30 is moved in a direction shown by an arrow S6 in FIG. 12-(B) by the decentering cam 143. Similarly, if the Y direction moving stage motor 152 is driven so that the rotational shaft 152-1 is rotated, the X direction moving stage 141 is moved in a direction shown by the arrow S6 in FIG. 12-(B) by the decentering cam 153.

If the rotational shaft part 142-1 or 152-1 is further rotated from this position, the sealing resin supply apparatus 30 or the X direction moving stage 141 is moved in a direction opposite to the direction shown by the arrow S6 in FIG. 12-(B), so that the position is changed to the position shown in FIG. 12-(A).

Thus, the sealing resin supply apparatus 30 is moved in the X1-X2 direction in the same plane surface by driving the X direction moving stage motor 142 and the X direction moving stage 141 is moved in the Y1-Y2 direction in the same plane surface by driving the Y direction moving stage motor 152, so that the sealing resin supply apparatus 30 is vibrated in the X direction and Y direction.

Figure 13:
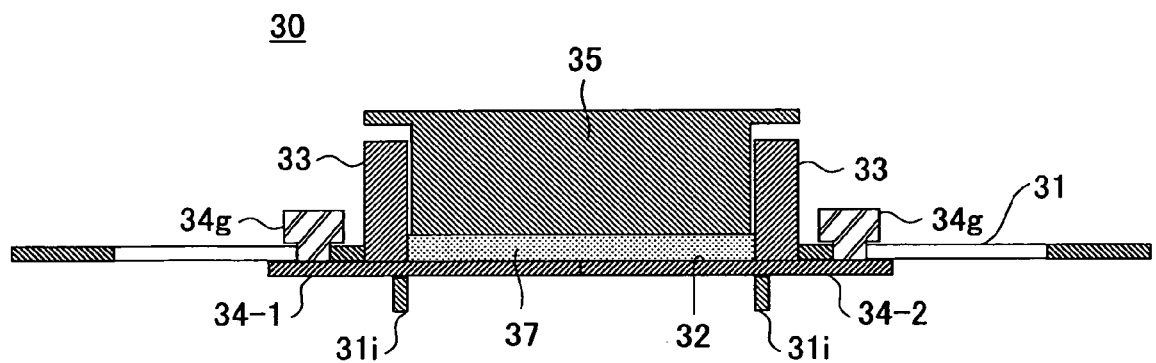
FIG. 13 is a view showing the sealing resin supply apparatus after the sealing resin supply apparatus is vibrated.

The sealing resin 37 in the sealing resin supply apparatus 30 to which vibration in the horizontal direction is applied is shown in FIG. 13.

A load by the own weight of the lid member 35 is applied from an upper part and the vibration in the horizontal directions is applied to the sealing resin supply apparatus 30, so that the sealing resin 37 is uniformly distributed in the sealing resin receiving part 36.

At the time of application of the load by the lid member 35, the lid member 35 is guided by the wall part 33 so that the lid member 35 uniformly presses the sealing resin 37 without tilting. At this time, air in the sealing resin receiving part 36 is discharged via the hole 35b shown in FIG. 11 provided in the lid member 35, so that the application of the load to the sealing resin 37 is immediately made.

Figure 14:
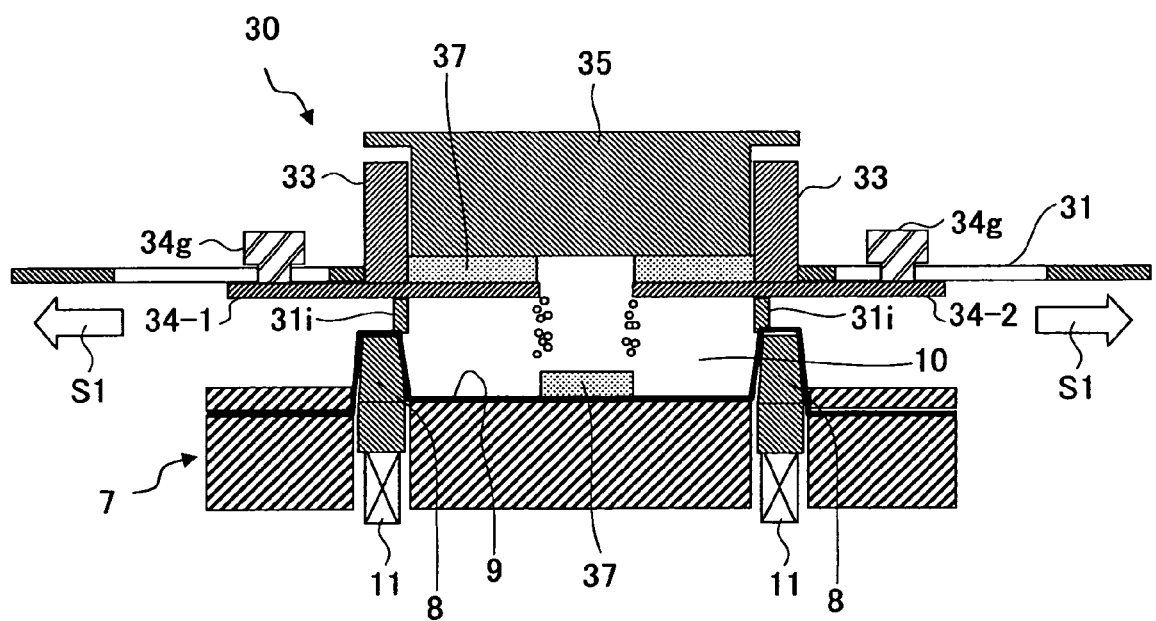
FIG. 14 is a view showing a state where the sealing resin supply apparatus is provided above a lower mold.

As shown in FIG. 14, the sealing resin supply apparatus 30 is positioned above the lower mold 7 heated at approximately 175° C. by a heating mechanism (not shown). In the sealing resin supply apparatus 30, the distribution of the received sealing resin 37 is uniform.

A cavity forming part 10 is formed in the center of the upper surface of the lower mold 7. The cavity forming part 10 is surrounded by the frame parts 8 elastically supported by the springs 11.

A release film 9 made of fluoride group resin or the like covers the bottom part of the cavity forming part 10 and the surface of the frame parts 8.

Lower ends of the support and guide parts 31i of the sealing resin supply apparatus 30 come in contact with upper surfaces of corresponding frame parts 8, so that the sealing resin supply apparatus 30 is positioned above the lower mold 7.

Because of this, the opening 32 of the sealing resin supply apparatus 30 is positioned so as to correspond to an opening of the cavity forming part 10 of the lower mold 7.

After that, as shown by arrows S1 in FIG. 14, the bottom plates 34-1 and 34-2 of the sealing resin receiving part 36 of the sealing resin supply apparatus 30 are slid, and the sealing resin 37 received in the sealing resin receiving part 36 falls into the cavity forming part 10 of the lower mold 7. At this time, the support and guide part 31i and the frame part 8 prevent the sealing resin 37 from being taken out of the cavity forming part 10.

As discussed above, the sealing resin 37 is uniformly distributed in the sealing resin receiving part 36 in advance and the load is applied to the lid member 35 from the upper part of the lid member 35. Therefore, even if the bottom plates 34-1 and 34-2 are slid from the center in left and right directions, the sealing resin 37 falling into the cavity forming part 10 of the lower mold 7 is received in the cavity forming part 10 while the thickness of the sealing resin 37 is uniform.

However, the sealing resin 37 starts becoming molten when falling into the heated lower mold 7. Hence, in order to make a melting viscosity of the falling sealing resin 37 uniformly stable, it is preferable that the sealing resin supply apparatus 30 be placed as close as possible to the lower mold 7 and the bottom plates 34-1 and 34-2 be opened at high speed.

Figure 15:
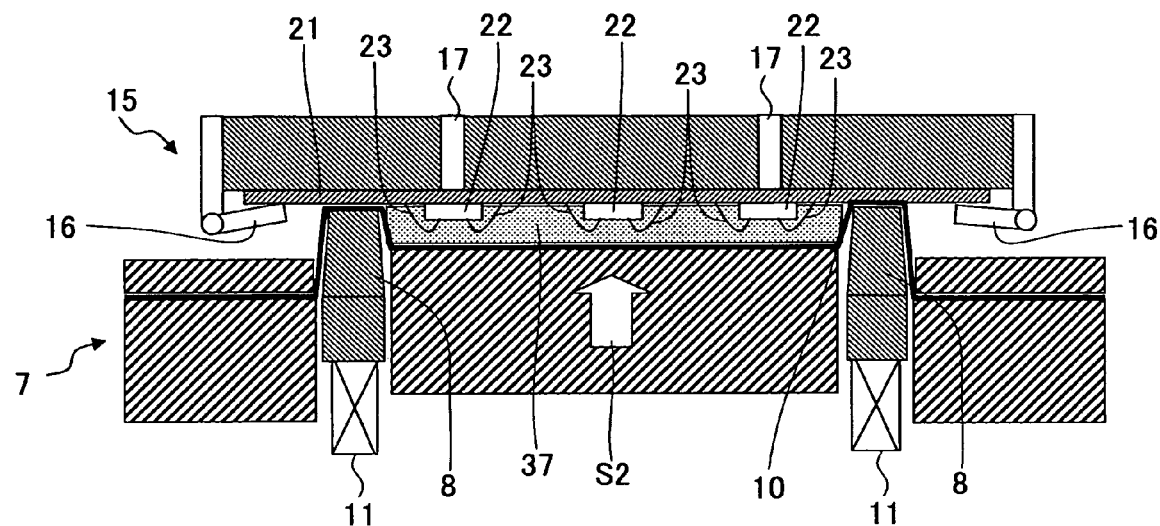
FIG. 15 is a view showing a state where an upper mold and the lower mold are closed in the first embodiment of the present invention.

Next, the sealing resin supply apparatus 30 is removed and the lower mold 7 is moved (raised) in the direction of an arrow S2 in FIG. 15, so that the upper mold 15 and the lower mold 7 are closed.

Plural semiconductor elements 22 are mounted on and fixed to the main surface of a single wiring board 21. The processed body, where the outside connection terminal of the semiconductor element 22 and the electrode terminal on the wiring board 21 are connected by the bonding wire 23, is held by the clamp part 16 and vacuum suction by the vacuum suction opening 17 so as to be arranged at the upper mold 15.

The upper mold 15 and the lower mold 7 are closed and the lower mold 7 is further raised in the direction shown by the arrow S2. The semiconductor element 22 and the bonding wire 23 on the wiring board 21 held by the upper mold 15 are dipped in the sealing resin 37 in the cavity forming part 10 of the lower mold 7 so that resin sealing is achieved.

At this time, since the sealing resin 27 is uniformly distributed in the cavity forming part 10 of the lower mold 7, the flow of the sealing resin 37 is drastically prevented. Hence, deformation and/or breaking of the bonding wire 23 due to the flow of the sealing resin and the contact of the bonding wire with another bonding wire can be prevented.

It is preferable to apply this embodiment in a case where the diameter of the bonding wire 23 is equal to or greater than 20 μm and equal to or less than 25 μm.

This embodiment is proper for resin sealing an electronic part by using sealing resin having a minimum melting viscosity of 300 poise. The melting viscosity of such resin becomes low approximately 3 through 5 seconds after the resin is heated. Therefore, it is necessary to finish the mold closing process as shown in FIG. 15 after the melting viscosity is reached.

While a case where the lower mold 7 is raised against the upper mold 15 in a mold closing process is shown in FIG. 15, the upper mold 15 may be lowered against the lower mold 7.

Second Embodiment

A method of resin sealing an electronic part of a second embodiment of the present invention is discussed with reference to FIG. 16 through FIG. 20.

In FIG. 16 through 20, parts that are the same as the parts shown in FIG. 8 through FIG. 15 are given the same reference numerals, and explanation thereof is omitted.

The first embodiment of the present invention discussed above can be applied to the case where the diameter of the bonding wire 23 is equal to or greater than approximately 20 μm and equal to or smaller than approximately 25 μm.

However, even if the resin sealing method of the first embodiment is applied so that the distribution of the sealing resin 37 in the cavity forming part 10 of the lower mold 7 is made uniform, in a case where the semiconductor element 22 has a larger volume, the sealing resin 37 is pressed and the flow of the sealing resin 37 may be generated in the periphery of the semiconductor element 22.

Because of this, in a case where the diameter of the bonding wire 23 is smaller than approximately 20 μm, deformation and/or breaking of the bonding wire 23 due to the flow of the sealing resin 37 and the contact of the bonding wire with another bonding wire may be generated.

In the second embodiment, it is possible to resin seal the electronic part where the bonding wire whose diameter is smaller is applied.

In this embodiment, in order to solve the above-mentioned problems, a designated-sized projection part is provided at a position corresponding to the position of the semiconductor element 22 mounted on the processed wiring board 21, in the lower surface of the lid member 41, namely a surface of the lid member 41 coming in contact with the sealing resin 37 received in the sealing resin receiving part 36.

Figure 16:
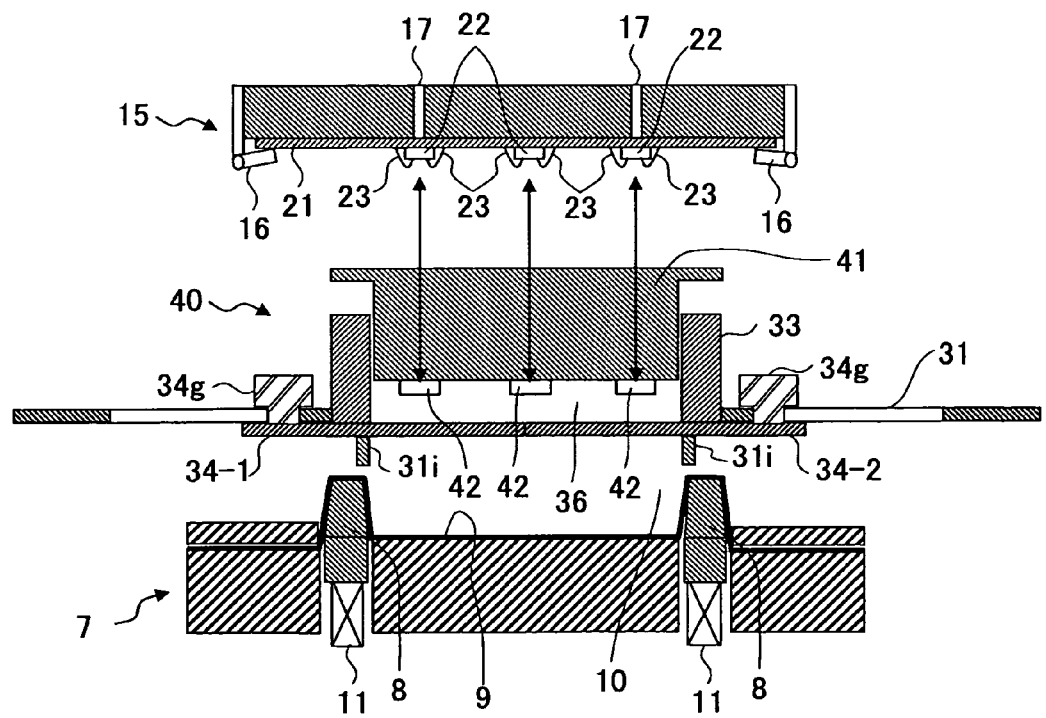
FIG. 16 is a view showing a structure of a sealing resin supply apparatus of a second embodiment of the present invention.

A structure of the sealing resin supply apparatus 40 of the second embodiment of the present invention is shown in FIG. 16.

In FIG. 16, a positional relationship between parts forming the upper mold 15 and the lower mold 7 and parts forming the sealing resin supply apparatus 40 is also illustrated.

The sealing resin supply apparatus 40 has a structure the same as that of the sealing resin supply apparatus 30 of the first embodiment of the present invention.

The opening of the sealing resin receiving part 36 at the sealing resin supply apparatus 40 has a configuration and measurement corresponding to the opening of the cavity forming part 10 of the lower mold 7.

Plural projection parts 42 are provided on the lower surface 41 facing the sealing resin receiving part 36. A size and position of the projection part 42 correspond to those of the semiconductor elements 22 mounted on the wiring board 21 being the sealed body.

An area facing the sealing resin of the projection part 42 is substantially equal to the area of the main surface of the semiconductor element 22. The height, a length in upper and lower directions in FIG. 16, of the projection part 42 is substantially equal to the height of the semiconductor element 22 from the surface of the wiring board. In other words, the volume of the projection part 42 is substantially equal to the volume of the semiconductor element 22 corresponding to the projection part 42.

If the volume of the projection part 42 is larger than the volume of the semiconductor element 22, the flow of the sealing resin 37 against the semiconductor element 22 may be generated at the time of mold closing. On the other hand, if the volume of the projection part 42 is smaller than the volume of the semiconductor element 22, the flow of the sealing resin 37 from one semiconductor element 22 to other semiconductor elements 22 may be generated.

Accordingly, the product of the area and height of the projection part 42, namely the volume of the projection part 42 should be substantially equal to the volume of the semiconductor element 22.

Figure 17:
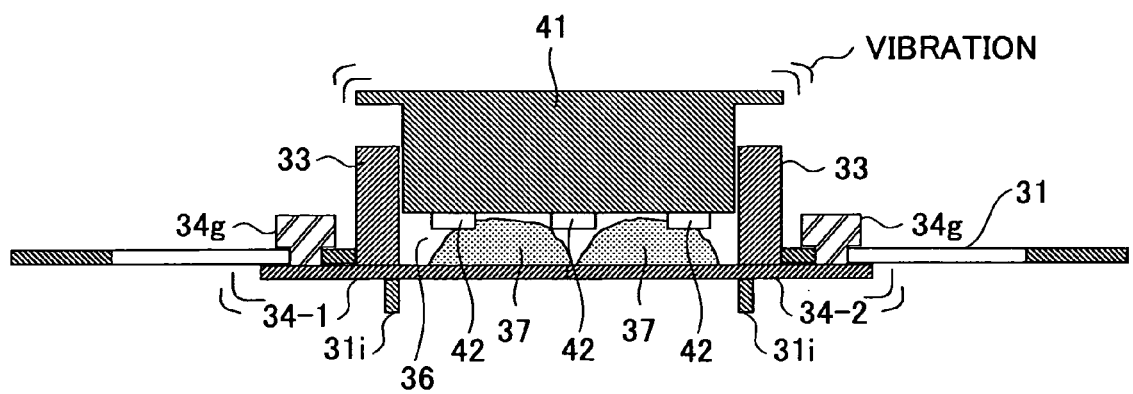
FIG. 17 is a cross-sectional view showing the sealing resin supply apparatus of the second embodiment of the present invention.

FIG. 17 shows where the sealing resin 37 is received in the sealing resin receiving part 36 of the sealing resin supply apparatus 40 and the lid member 41 is provided.

In a state where the bottom plates 34-1 and 34-2 provided on the bottom surface of the sealing resin receiving part 36 of the sealing resin supply apparatus 40 are closed, a designated amount of the powder or granular sealing resin 37 is received in the sealing resin receiving part 36.

As shown in FIG. 17, just right after the sealing resin 37 is received in the sealing resin receiving part 36, the thickness of the sealing resin 37 in the sealing resin receiving part 36 is not uniform and therefore the distribution of the sealing resin 37 in the sealing resin receiving part 36 is not uniform.

Therefore, in order to make the distribution of the sealing resin 37 in the sealing resin receiving part 36 be uniform, a load is applied to the sealing resin 37 by using a weight applied by the lid member 41 and the sealing resin supply apparatus 40 is vibrated in horizontal directions.

That is, in this embodiment, the lid member 41 having plural projection parts 42 is engaged with the sealing resin receiving part 36 so that the load is applied to the sealing resin, and the sealing resin supply apparatus 40 is vibrated in the horizontal directions.

Figure 18:
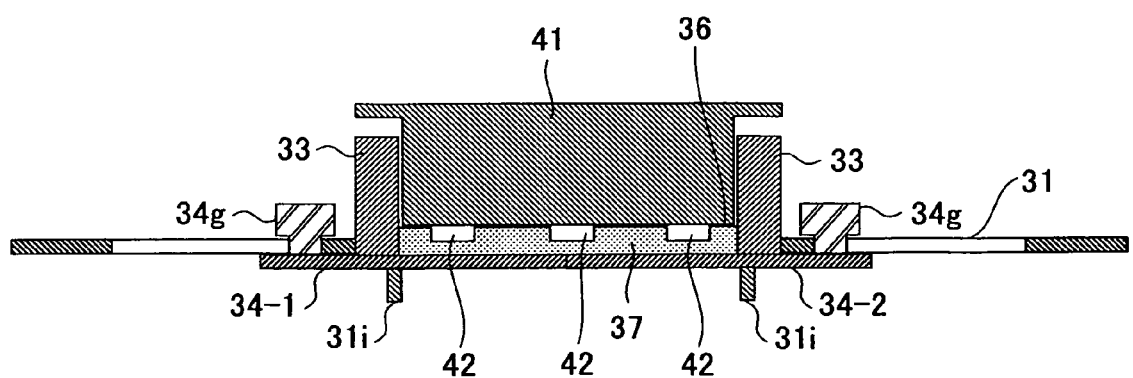
FIG. 18 is a view showing a state where sealing resin is scattered inside of a sealing resin receiving part.

As a result of this, the sealing resin 37 is uniformly dispersed in the sealing resin receiving part 36, as shown in FIG. 18.

Figure 19:
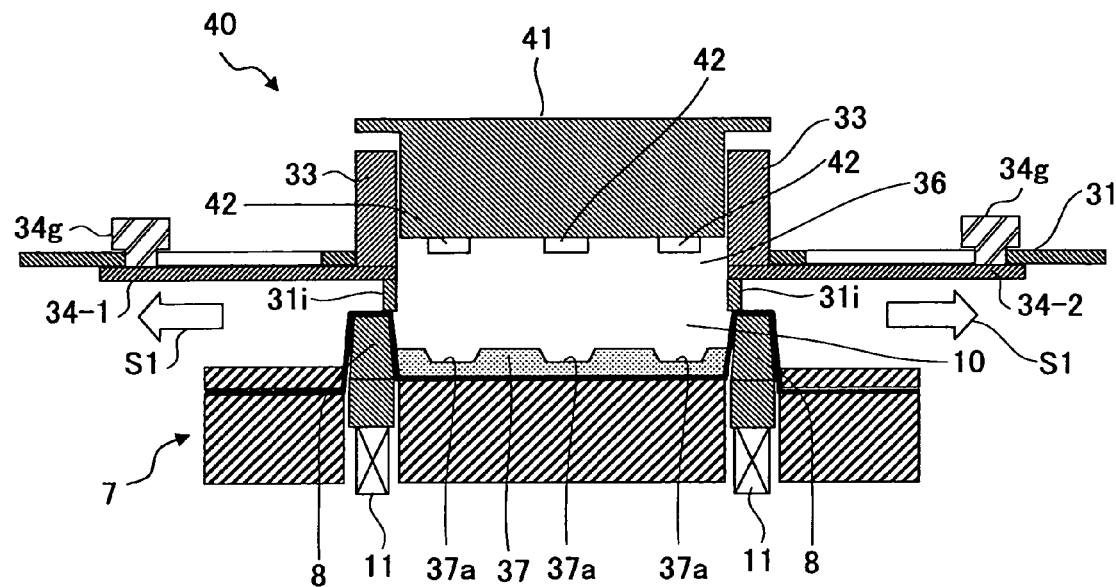
FIG. 19 is a view showing a state where the sealing resin supply apparatus of the second embodiment of the present invention is provided above the lower mold.

After that, as shown in FIG. 19, the sealing resin supply apparatus 40 is provided above the lower mold 7 heated at approximately 175° C. by a heating mechanism (not shown).

At this time, if the bottom plates 34-1 and 34-2 of the sealing resin receiving part 36 of the sealing resin supply apparatus 40 are slid in the directions shown by arrows S1, the sealing resin 37 received in the sealing resin receiving part 36 falls into the cavity forming part 10 of the lower mold 7.

As discussed above, the sealing resin 37 is uniformly distributed in the sealing resin receiving part 36 and the load is applied to the lid member 35 from the lid member 41 having the projection parts corresponding to the semiconductor elements.

Therefore, even if the bottom plates 34-1 and 34-2 are slid from the center in left and right directions, the sealing resin 37 falling into the cavity forming part 10 of the lower mold 7 is received in the cavity forming part 10 while the thickness of the sealing resin 37 is uniform and the sealing resin 37 has concave parts 37a corresponding to the projection parts 42.

However, the sealing resin 37 starts becoming molten when falling on the heated lower mold 7. Hence, in order to make a melting viscosity of the falling sealing resin 37 uniformly stable, it is preferable that the sealing resin supply apparatus 40 be moved as close as possible to the lower mold 7 and the bottom plates 34-1 and 34-2 be opened at high speed.

Figure 20:
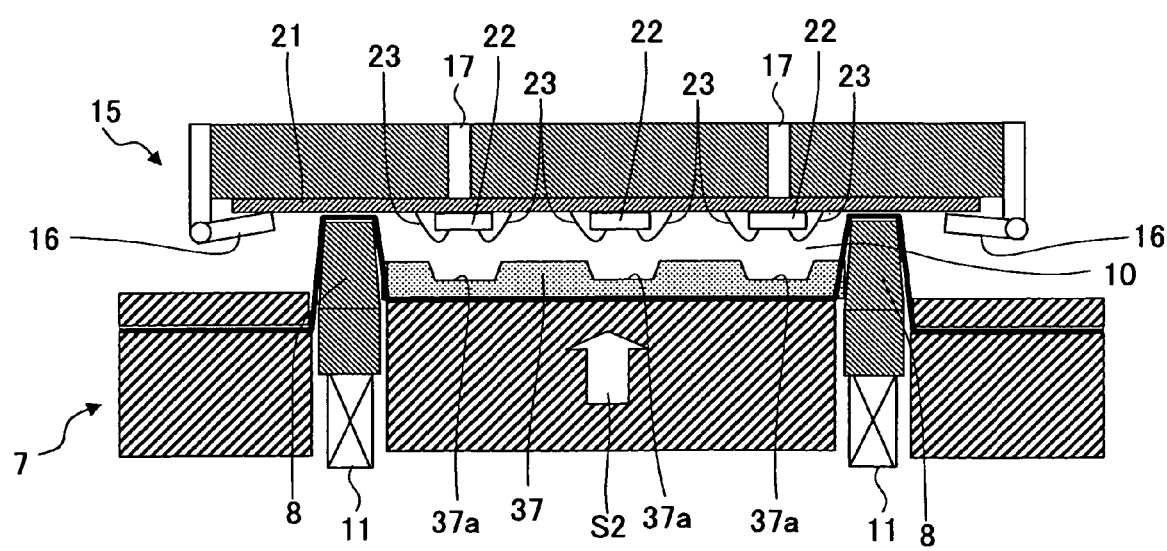
FIG. 20 is a view showing a state where the upper mold and the lower mold are closed in the second embodiment of the present invention.

Next, the sealing resin supply apparatus 40 is removed and the lower mold 7 is moved (raised) in the direction of an arrow S2 in FIG. 20, so that the upper mold 15 and the lower mold 7 are closed.

Plural semiconductor elements 22 are mounted on and fixed to the main surface of a single wiring board 21. The processed body, where the outside connection terminal of the semiconductor element 22 and the electrode terminal on the wiring board 21 are connected by the bonding wire 23, is held by the clamp part 16 and vacuum suction by the vacuum suction opening 17 so as to be arranged at the upper mold 15.

The upper mold 15 and the lower mold 7 are closed and the lower mold 7 is further raised in the direction shown by the arrow S2. The semiconductor element 22 and the bonding wire 23 on the wiring board 21 held by the upper mold 15 are dipped in the sealing resin 37 in the cavity forming part 10 of the lower mold 7 so that resin sealing is achieved.

In this embodiment, by providing the projection part 42 corresponding to the sealed semiconductor element 22 at the lid member 41 applying the load to the sealing resin 37, the concave parts 37a are formed at parts corresponding to the semiconductor elements 22 in the sealing resin supply apparatus 40 so that the amount of the sealing resin 37 is reduced.

Under this distribution, the sealing resin 37 is received in the cavity forming part 10 of the lower mold 7.

Therefore, at the time of resin sealing, pressing of the sealing resin 37 by the semiconductor elements 22 may occur so that the flow of the sealing resin 37 in the periphery of the semiconductor element 22 may not be generated. Because of this, deformation and/or breaking of a bonding wire 23 due to a flow of sealing resin 37 and contact of the bonding wire with another bonding wire can be prevented.

Thus, according to this embodiment, the flow of the sealing resin due to existence of the electronic parts such as the semiconductor elements 22 can be reduced. Therefore, this embodiment is useful when the diameter of the bonding wire 23 is smaller than 20 μm.

This embodiment is proper for resin sealing an electronic part by using sealing resin having a minimum melting viscosity of 300 poise.

While a case where the lower mold 7 is raised against the upper mold 15 in a mold closing process shown in FIG. 20, the upper mold 15 may be lowered against the lower mold 7.

In addition, the projection part 42 is normally formed together with the lid member 41. However, the projection part 42 may be formed separately from the lid member 41 and then made uniform with the lid member 41 by means of engaging, adhering, screw-fixing, or the like.

By forming the projection part 42 separately from the lid member 41, it is possible for the projection part 42 to easily correspond to the semiconductor element having a different volume. In addition, it is possible to reduce manufacturing cost of the lid member or the projection part.

Third Embodiment

A method of resin sealing an electronic part of a third embodiment of the present invention is discussed with reference to FIG. 21 through FIG. 27.

In FIG. 21 through 27, parts that are the same as the parts discussed in the first embodiment and the second embodiment are given the same reference numerals, and explanation thereof is omitted.

As discussed above, a semiconductor device may be manufactured by the following method. That is, plural semiconductor elements are mounted on a single wiring board, the outside connection terminal of the semiconductor element and the electrode terminal on the wiring board are connected by the bonding wire, the semiconductor elements, the bonding wire and the wiring board are resin sealed in a lump (one process), and then the wiring board and the resin sealed part are cut and divided as corresponding to the semiconductor elements.

In this manufacturing method, if there is a bad portion in the wiring way on the wiring board, a method of resin sealing may be applied without mounting the semiconductor element on the bad portion.

In this case, if the sealing resin is received in the lower mold by using the sealing resin supply apparatus where the lid member having the projection part corresponding to the semiconductor element is applied as discussed in the second embodiment of the present invention, the flow of the sealing resin may be generated at a part of the wiring board where the semiconductor element is not mounted when the upper mold and lower mold are closed.

This is because the lid member having the projection parts based on the assumption that all of the semiconductor elements are mounted is applied so that a concave part giving no corresponding semiconductor element is formed in the sealing resin. This concave part forms a space at the time of resin sealing, and thereby the flow of the resin for filling the space may be generated.

Due to such a flow of the sealing resin, deformation and/or breaking of the bonding wire may happen and a short circuit with another bonding wire may be generated.

The third embodiment of the present invention provides a method for preventing unnecessary flow of the sealing resin in resin sealing whose subject is the wiring board including the area where a semiconductor element is not mounted.

In this embodiment, a projection part movable in upper and lower directions is provided in the lid member of the sealing resin supply apparatus so that the projection part projects based on the existence of the semiconductor element mounted on the wiring board, and thereby the above-mentioned problem can be solved.

Figure 21:
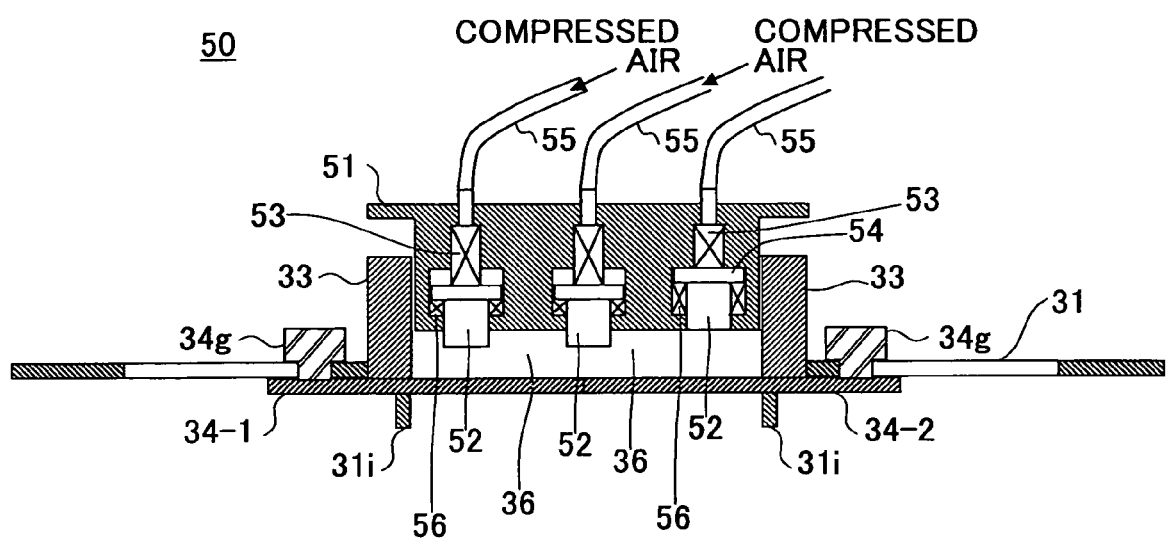
FIG. 21 is a view showing a structure of a sealing resin supply apparatus of a third embodiment of the present invention.

A structure of the sealing resin supply apparatus in the third embodiment is discussed with reference to FIG. 21.

The projection parts 52 are provided on the lower surface of the lid member 51 of the sealing resin supply apparatus 50, the lower surface facing the sealing resin receiving part 36. The projection part 52 has a volume corresponding to the volume of the semiconductor element. The projection parts 52 are provided so as to correspond to the position of the semiconductor elements mounted on the wiring board.

The projection can move so as to project from the lid member 51 in a direction of the sealing resin receiving part 36.

The projection part 52 is connected to an air cylinder 53 and a piston attached to the air cylinder 53 is provided in the lid member 51.

An air flow tube 55 is connected to the air cylinder 53. The other end of the air flow tube 55 is connected to a compressed air source (not shown in FIG. 21) via an electromagnetic valve (not shown in FIG. 21).

By opening the electromagnetic valve, compressed air flows into the air cylinder 53 through the air flow tube 55. As a result of this, the piston 54 attached to the air cylinder 53 moves downward, so that the projection part 52 connected to the piston 54 moves in the lid member 51 so as to project from the lower surface of the lid member 51 in the direction of the sealing resin receiving part 36.

A spring 56 is provided in the periphery of the projection part 52 at a lower part in the air cylinder 53. In a state where the compressed air is not flowing to the air cylinder 53 through the air flow tube 55, the projection part 52 is pushed to an air cylinder side by the spring 56 and therefore the projection part 52 does not project from the lower surface of the lid member 51.

Figure 22:
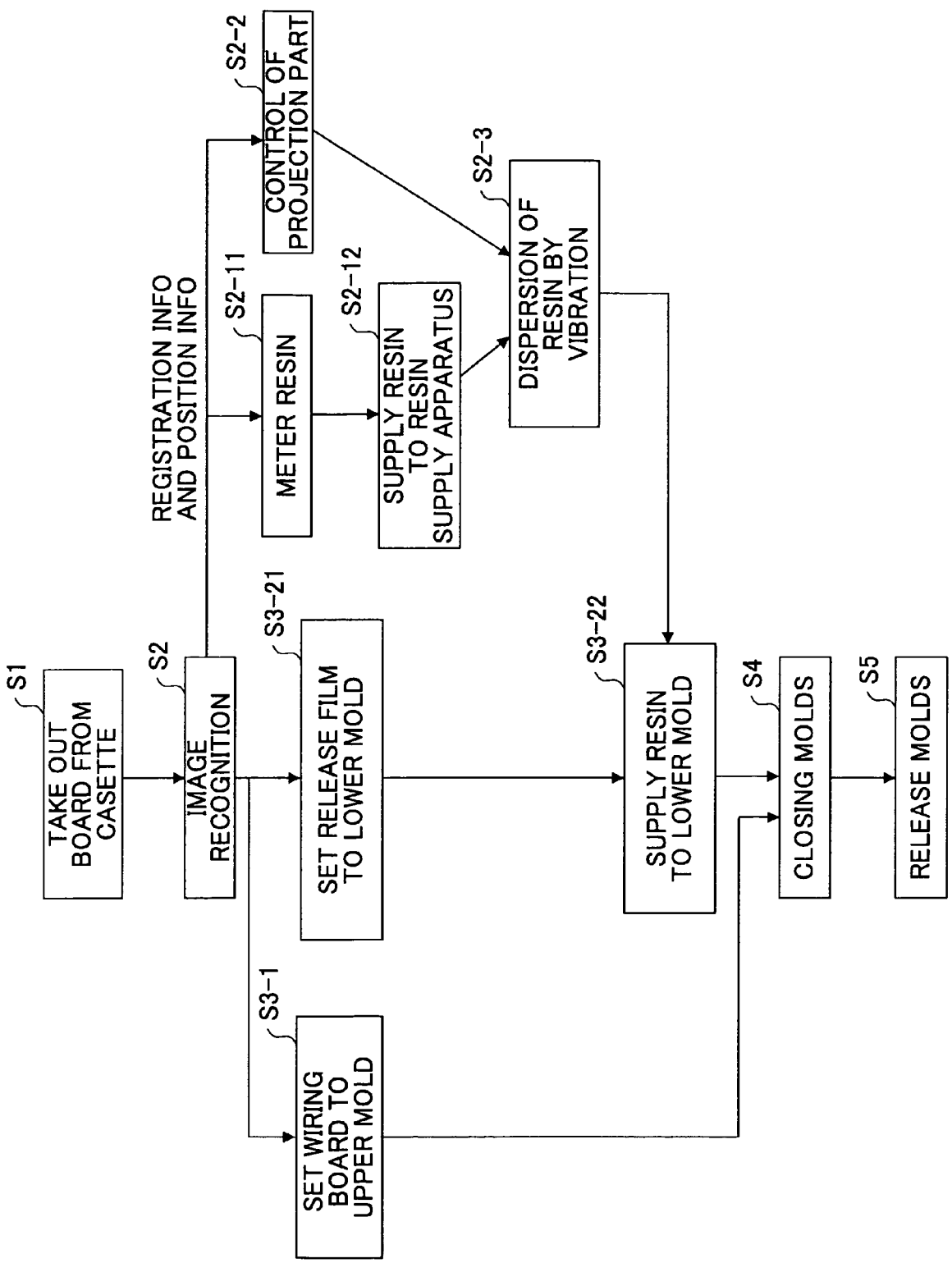
FIG. 22 is a flowchart showing a flow of a resin sealing process using the sealing resin supply apparatus shown in FIG. 21.

Next, a resin sealing method using the sealing resin supply apparatus 50 having the lid member 51 discussed above is discussed with reference to FIG. 22. Here, FIG. 22 is a flowchart showing a flow of a resin sealing process using the sealing resin supply apparatus 50 shown in FIG. 21.

First, a wiring board that is a subject of the resin sealing process is taken out from a board receiving cassette in step S1, so that an image recognition process of the wiring board is implemented in step S2.

Plural semiconductor elements are mounted on the wiring board. The outside connection terminal of the semiconductor element is connected to an electrode terminal on the wiring board by the bonding wire.

The image recognition process of such a wiring board is discussed with reference to FIG. 23.

The image recognition process is implemented by an image recognition apparatus (not shown). In a data base 70 of the image recognition apparatus, layout information of the wiring board, information with respect to the weight of the sealing resin corresponding to the volume of a single semiconductor element, and others are registered in advance (registration information). Here, the layout information is with respect to the number, position, and direction of the semiconductor elements in a case where all semiconductor elements to be mounted are mounted on the wiring board.

On the other hand, existence of the semiconductor elements 22 on the processed wiring board 21, which is taken out from the board receiving cassette and the resin sealing process is applied to, is recognized by an imaging part 71 such as a camera. For example, in an example shown in FIG. 23, it is recognized that the semiconductor elements 22 are not mounted at parts numbered "3" and "12" (position information).

The position information and the registration information are compared. Data of the weight of the sealing resin corresponding to the volumes of the semiconductor elements not mounted on the wiring board, obtained by multiplying the number of the semiconductor element not mounted on the wiring board and the weight of the sealing resin corresponding to the volume of a single semiconductor element, are sent to a resin metering apparatus 80 shown in FIG. 24.

Figure 23:
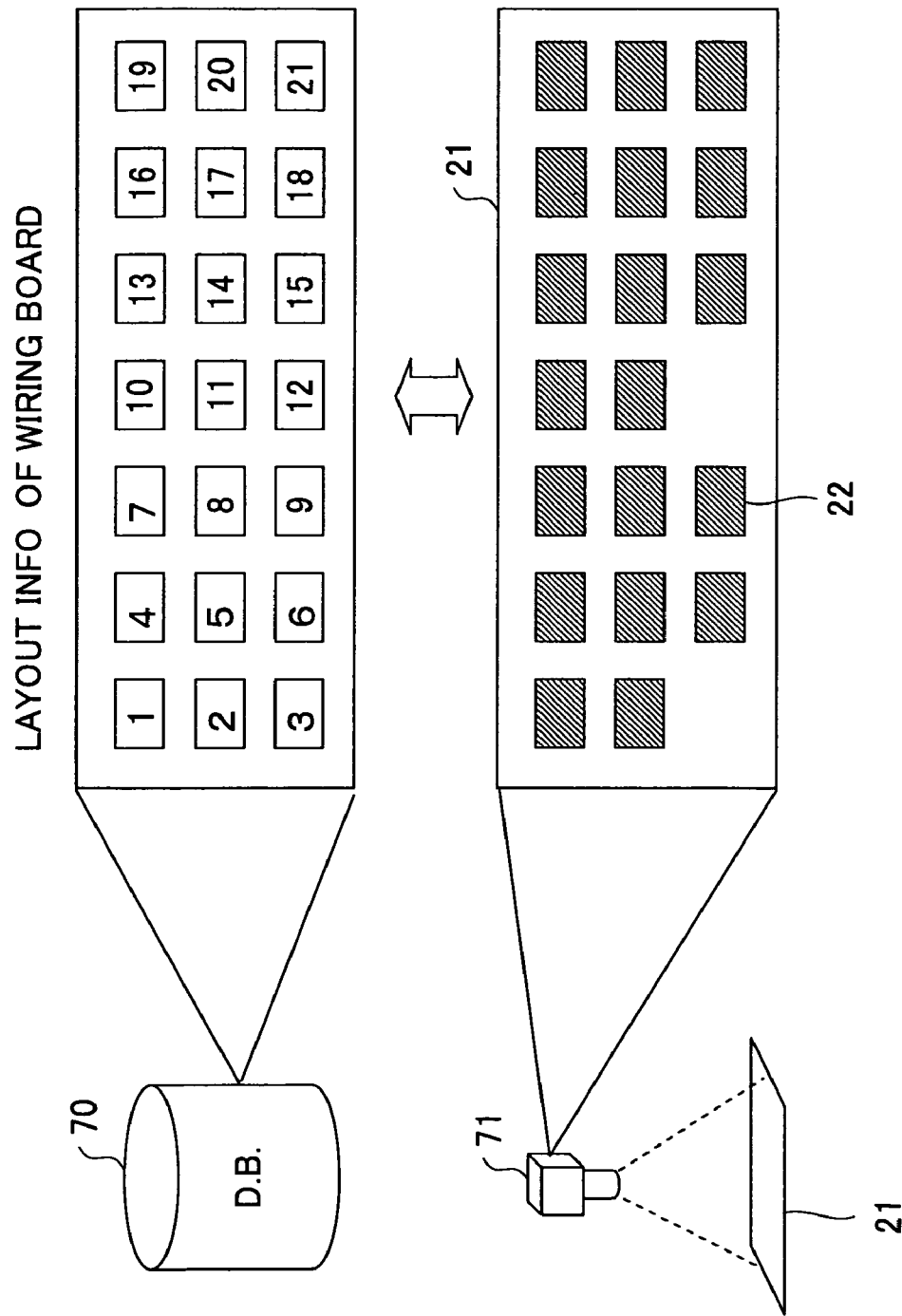
FIG. 23 is a view for explaining an image recognition process of a wiring board.

In an example shown in FIG. 23, data of the weight of the sealing resin whose amount corresponds to the volumes of two semiconductor elements are sent to the resin metering apparatus 80.

Figure 24:
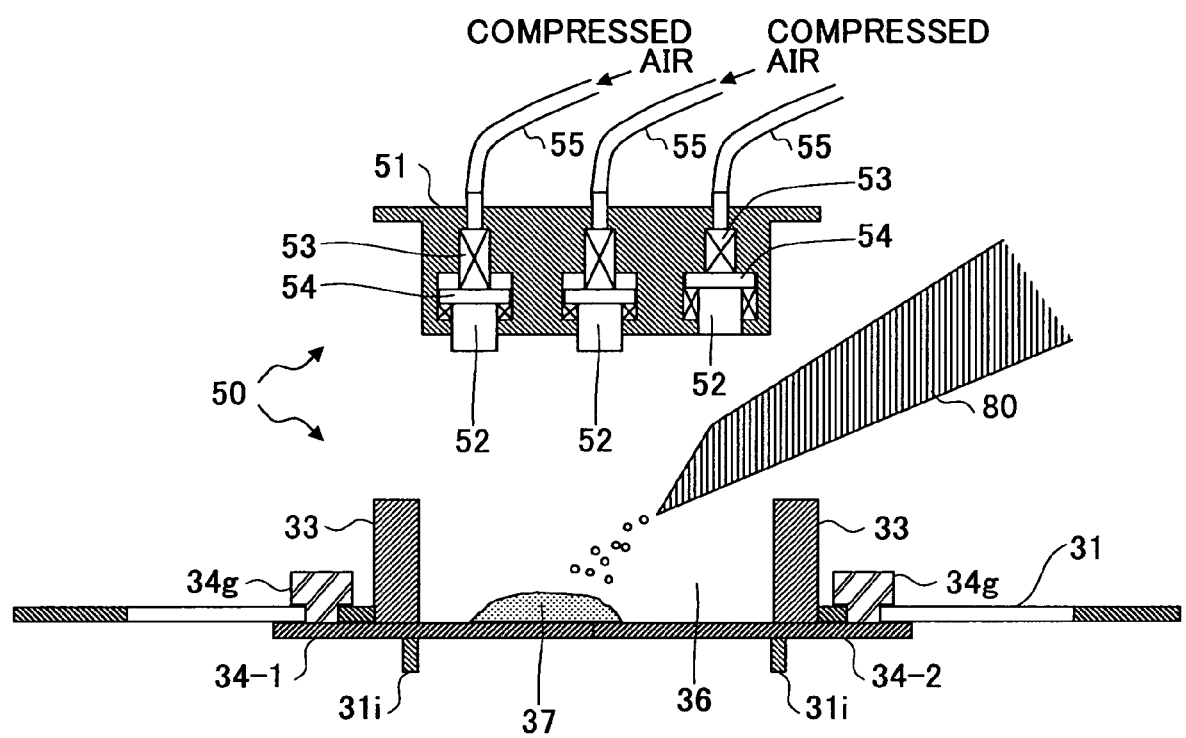
FIG. 24 is a first view showing an operation of a sealing resin supply apparatus of a third embodiment of the present invention.

In the sealing resin metering apparatus 80, the amount of the sealing resin to be supplied to the sealing resin supply apparatus 50 is metered in step S2-11. This metering is done by adding the amount of the sealing resin corresponding to the volume of the semiconductor element not mounted on the wiring board to the amount of the sealing resin to be supplied to the sealing resin supply apparatus 50 when all of the semiconductor elements are mounted on the wiring board. The metered sealing resin is supplied, as shown in FIG. 24, to the sealing resin receiving part 36 of the sealing resin supply apparatus 50 in step S2-12.

In addition, the position information with respect to the existence of the semiconductor element mounted on the wiring board, the information being recognized by the imaging part 71, is sent to the sealing resin supply apparatus 50.

As discussed above, the projection parts 52 which can project from the lid member 51 are provided in positions corresponding to the arrangement of the semiconductor elements on the wiring board.

The projection parts 52 are provided in positions corresponding to the semiconductor elements at the lid member 51. Based on the position information received from the sealing resin metering apparatus 80, the sealing resin supply apparatus 50 makes the projection parts 52 project at a part corresponding to a semiconductor element at the lid member 51 and not project in a case where there is no corresponding semiconductor element on the wiring board (step S2-2).

In other words, the position information of the semiconductor element on the wiring board is made to be related to a control signal of the electromagnetic valve of the sealing resin supply apparatus 50, so that taking in and out of the projection part 52 of the lid member is controlled by controlling the corresponding electromagnetic valve.

The electromagnetic valve corresponding to the part of the wiring board where the semiconductor element is mounted is opened so that the compressed air flows in the air cylinder 53 and the piston 54 moves downward. As a result of this, the projection part 52 connected to the piston 54 is made to project, in the direction of the sealing resin receiving part 36, from the lower surface of the lid member 51 to the outside of the lid member 51.

On the other hand, the electromagnetic valve corresponding to the part where a semiconductor element is not mounted is not opened so that the compressed air does not flow in the air cylinder 53. As a result of this, the projection part 52 corresponding to this part does not project from the lower surface of the lid member 51 to the outside of the lid member 51. A surface of the projection part corresponding to this part forms the same surface as a lower surface of the lid member 51 facing the sealing resin receiving part 36.

In the example shown in FIG. 24, a projection part situated right-most among three projection parts 52 corresponds to the part where a semiconductor element is not provided and does not project from the lower surface of the lid member 51.

Figure 25:
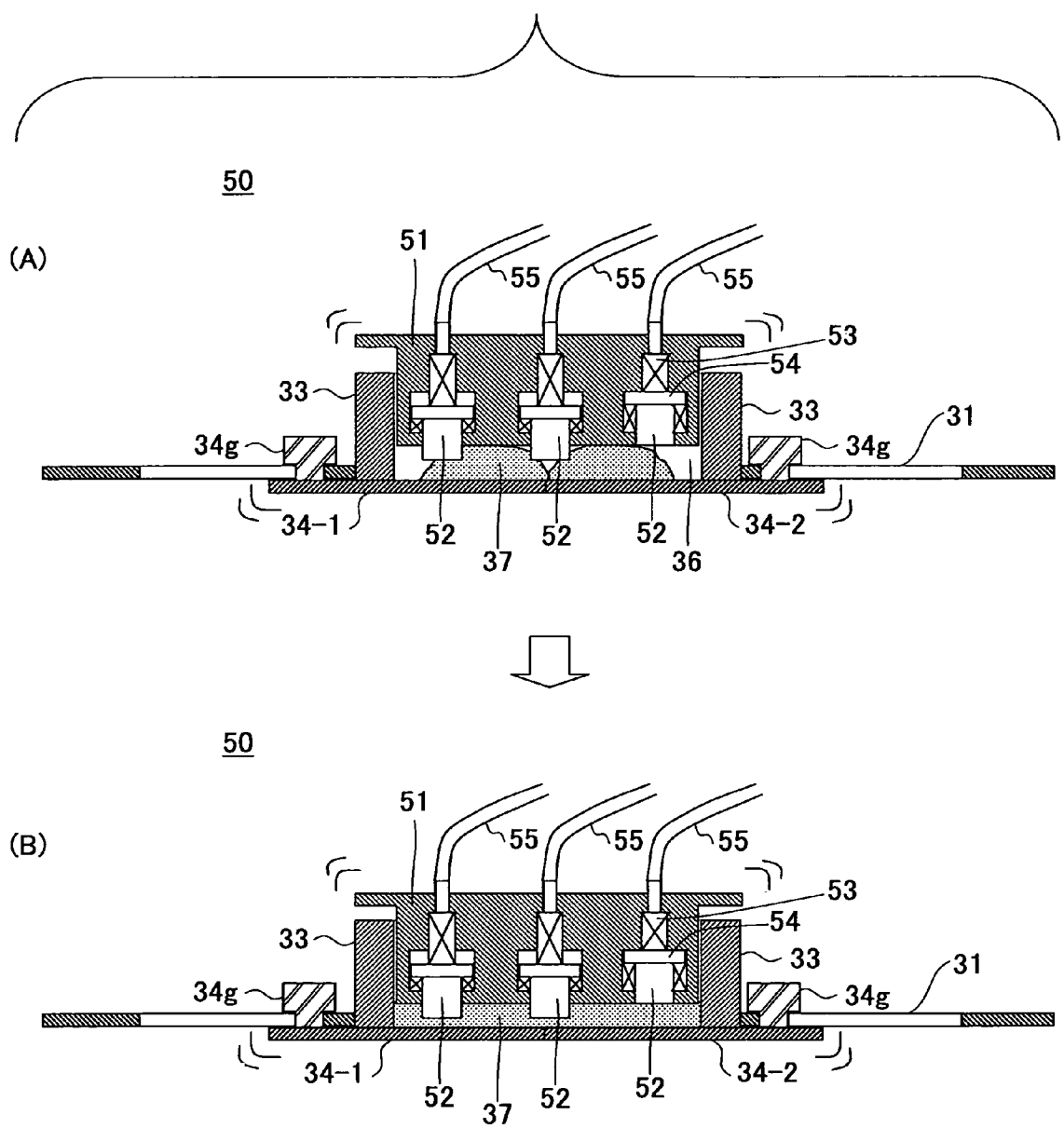
FIG. 25 is a second view showing the operation of the sealing resin supply apparatus of the third embodiment of the present invention.

Next, as shown in FIG. 25-(A), the lid member 51 where the projection parts 52 are arranged as corresponding to the existence of the semiconductor elements 22 is engaged with the sealing resin receiving part 36 and the load is applied from the upper part to the sealing resin 37 by the own weight of the lid member 51. In addition, the sealing resin supply apparatus 50 is vibrated in the horizontal directions by a part similar to that in the above-discussed embodiment.

As a result of this, as shown in FIG. 25-(B), the sealing resin 37 is uniformly dispersed in the sealing resin receiving part 36. In other words, the sealing resin is received in an area corresponding to the area where a semiconductor element is not provided on the wiring board without generation of an air space.

Plural semiconductor elements 22 are mounted on and fixed to the main surface of a single wiring board 21. The processed body, where the outside connection terminal of the semiconductor element 22 and the electrode terminal on the wiring board 21 are connected by the bonding wire 23, is held by the clamp part 16 and vacuum suction by the vacuum suction opening 17 so as to be arranged at the upper mold 15 (step S3-1).

The cavity forming part 10 is formed in the center of the upper surface of the lower mold 7. The periphery of the cavity forming part 10 is surrounded by the frame part 8 elastically supported by the spring 11.

The release film 9 made of, for example, fluoride group resin covers from the bottom part of the cavity forming part 10 and the surface of the frame part 8 in step S3-21.

Figure 26:
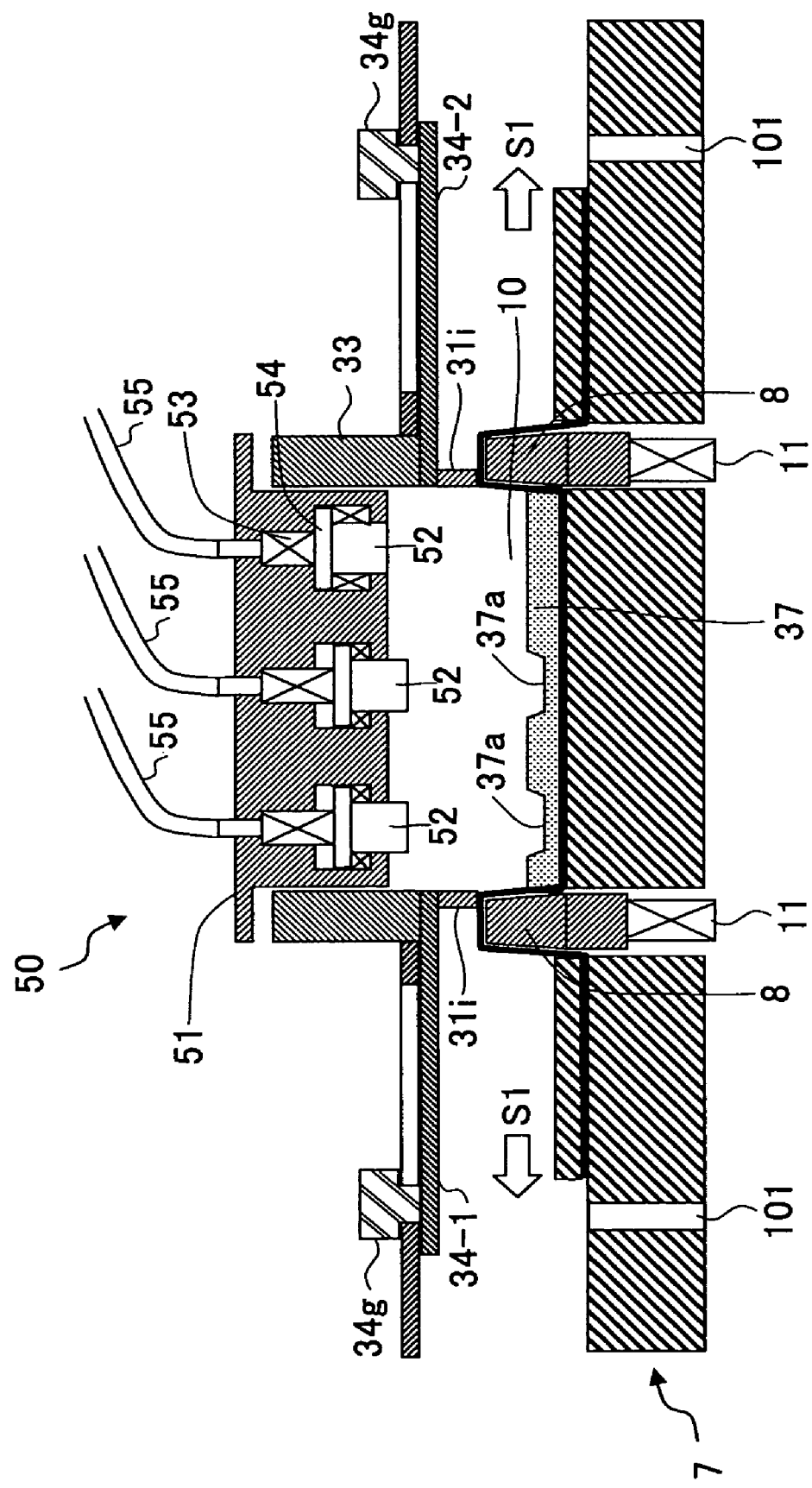
FIG. 26 is a view showing a state where the sealing resin supply apparatus of the third embodiment of the present invention is provided above the lower mold.

In a state where the lower mold 7 is heated by the heating mechanism (not shown) at approximately 175° C., as shown in FIG. 26, a lower end of the support and guide part 31i comes in contact with an upper surface part of the frame part 8, and the sealing resin supply apparatus 50 receiving the sealing resin is mounted on the lower mold 7.

At this time, the opening 32 of the sealing resin supply apparatus 50 corresponds to an opening of the cavity forming part 10 of the lower mold 7.

The bottom plates 34-1 and 34-2 of the sealing resin receiving part 36 of the sealing resin supply apparatus 50 are slid in the direction shown by arrows S1 so that the sealing resin 37 falls into the cavity forming part 10 of the lower mold 7 in step S3-22.

As discussed above, the sealing resin 37 corresponds to the projection of the projection parts 52 and is uniformly dispersed in the sealing resin receiving part 36. The load is applied to the sealing resin 37 by the lid member 51 having the projection parts 52.

Therefore, even if the bottom plates 34-1 and 34-2 are slid from the center in right and left directions, the sealing resin 37 falling in the cavity forming part 10 keeps the concave part 37a corresponding to the projection of the projection part 52 and keeps an uniform density distribution.

As a result of this, the sealing resin 37 falling in the cavity forming part 10 of the lower mold 7 has the same distribution as that in the sealing resin receiving part 36 of the sealing resin supply apparatus 50. In other words, in the sealing resin 37 received in the cavity forming part 10 of the lower mold 7, the concave part 37a corresponding to the projection part 52 is formed in a position corresponding to the position of the semiconductor element 22 mounted on the wiring board 21.

On the other hand, since the projection part 52 does not project at a part corresponding to the position where a semiconductor element 22 is not mounted on the wiring board 21, the concave part 37a is not formed there.

Next, the lower mold 7 and the upper mold 15 are closed in step S4.

The semiconductor element 22 mounted on and fixed to the wiring board 21 held by the upper mold 15 and the bonding wire 21 are dipped in the molten sealing resin 37 in the cavity forming part 10 formed in the lower mold 7. The upper mold 15 and the lower mold 7 are closed so that the semiconductor element 22 is received in the concave part 37a of the sealing resin 37.

Figure 27:
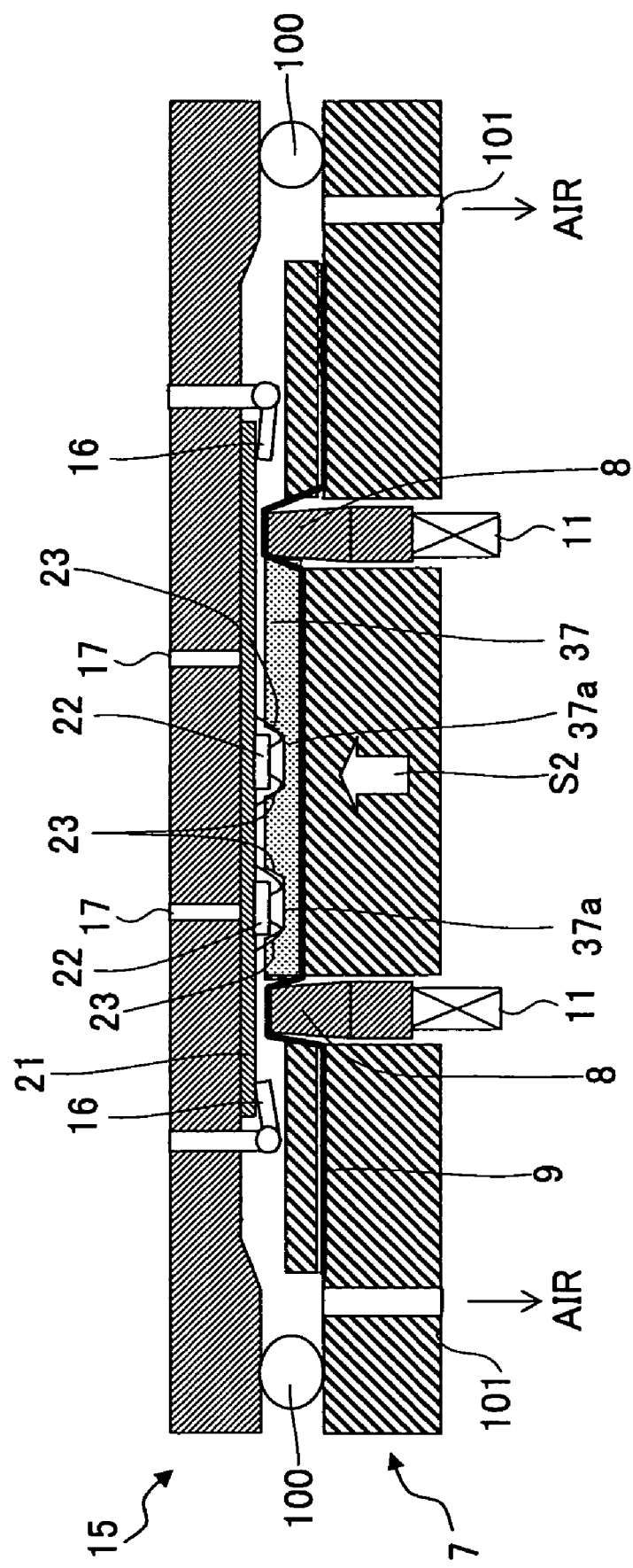
FIG. 27 is a view showing a state where the upper mold and the lower mold are closed in the third embodiment of the present invention.

In this case, as shown in FIG. 27, in order to prevent the generation of voids in the sealing resin 37 due to the air existing between the upper mold 15 and the lower mold 7, it is preferable that the space between the upper mold 15 and the lower mold 7 be in a vacuum state just before mold closing.

Because of this, in the example shown in FIG. 27, an elastic packing 100 such as rubber is provided between the vicinity of an edge of the upper mold 15 and the vicinity of an edge of the lower mold 7, so that a closed space is formed by the packing 100, the upper mold 15 and the lower mold 7.

Just before the mold closing, the air in the closed space is discharged via a discharging hole 101 provided inside of the packing 100 at the lower mold 7 so that a designated vacuum state is formed.

The above-discussed sealing part and vacuum part can be applied in the first and second embodiments.

After resin sealing is completed, the upper mold 15 and the lower mold 7 are released in step S5.

Thus, in this embodiment, the amount of the sealing resin used for the sealing process is determined as corresponding to the existence of the semiconductor elements mounted on the wiring board to be sealed. In addition, the projection part is provided at the lid member of the sealing resin supply apparatus and the projection parts project as corresponding to the existence of the semiconductor elements on the wiring board, so that the distribution of the sealing resin can be made proper.

Therefore, even if the wiring board includes a part where the semiconductor element is mounted and a part where a semiconductor element is not mounted, at the time of resin sealing it is possible to prevent generation of the flow of the sealing resin to the part where a semiconductor element is not mounted. Hence, deformation and/or breaking of a bonding wire due to a flow of sealing resin and a contact between the bonding wire and another bonding wire can be prevented.

This embodiment is proper for resin sealing an electronic part by using sealing resin having a minimum melting viscosity of 300 poise.

As discussed above, in the first through third embodiments, the lower end of the support and guide part 31i comes in contact with the upper surface part of the frame part 8, and the sealing resin supply apparatus 30, 40, or 50 is mounted on the lower mold 7. However, the present invention is not limited to this. For example, instead of the support and guide part 31i, a pillar state leg part or a wall state leg part may be provided at the lower surface of a base plate part in the periphery of the wall part 33 such as a rectangle without one side part 31*h* for mechanical support of the sealing resin supply apparatus or positioning of the lower mold 7.

As long as sliding of the bottom plates 34-1 and 34-2 is not limited, a position of the pillar state leg part or the wall state leg part is not limited to this.

The position and height of the pillar state leg part or the wall state leg part are selected so that the lower surface of the sealing resin supply apparatus and the upper surface of the frame part 8 of the lower mold 7 are parallel and a gap between the lower surface of the sealing resin supply apparatus and the upper surface of the frame part 8 of the lower mold 7 is made as small as possible.

In this case, a hole or a groove is provided in the lower mold so as to receive the pillar state leg part or the wall state leg part for positioning.

Fourth Embodiment

A method of resin sealing an electronic part of a fourth embodiment of the present invention is discussed with reference to FIG. 28 through FIG. 30.

Figure 28:
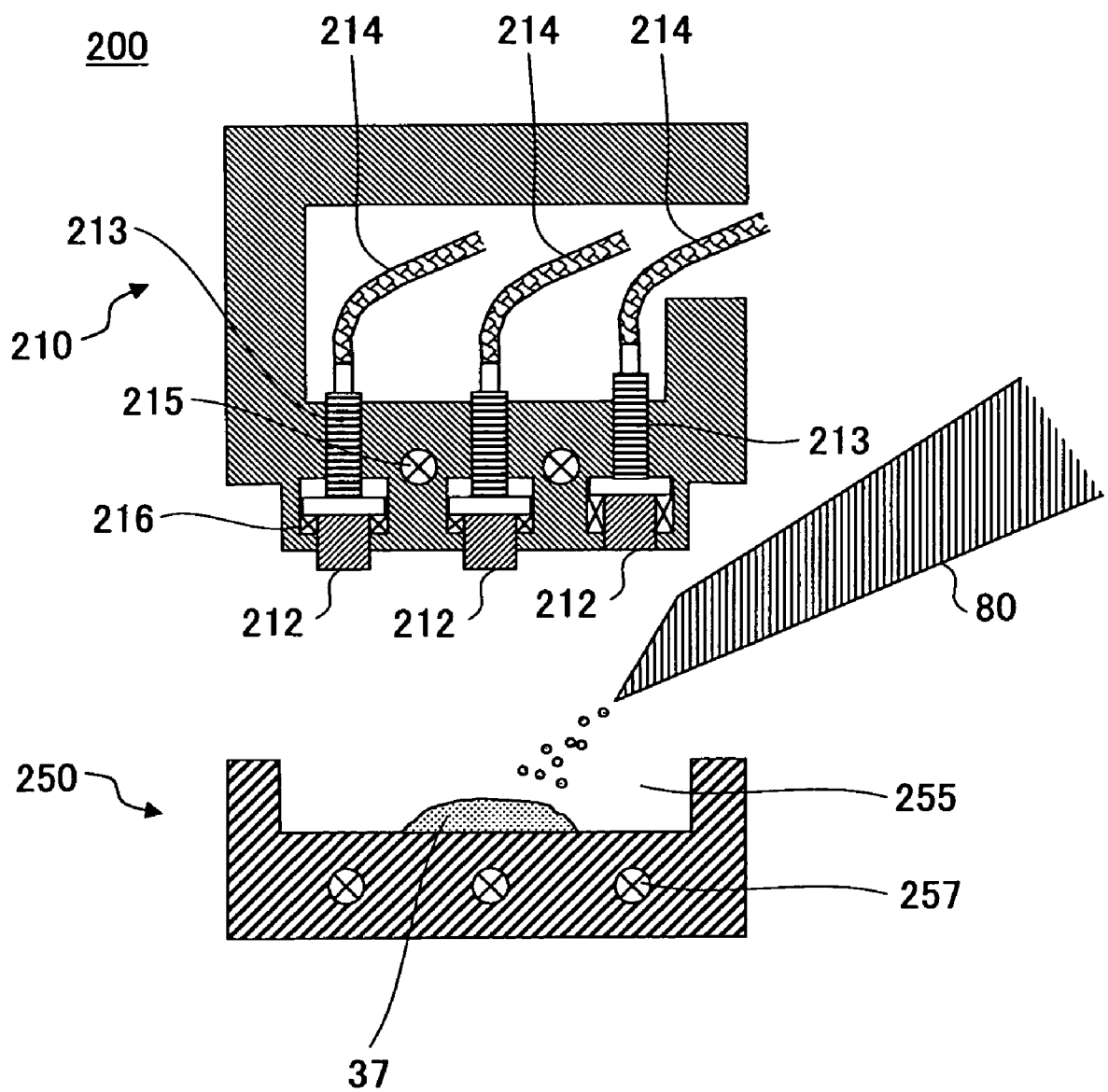
FIG. 28 is a view a structure of a sealing resin solidification apparatus of a fourth embodiment of the present invention.
Figure 29:
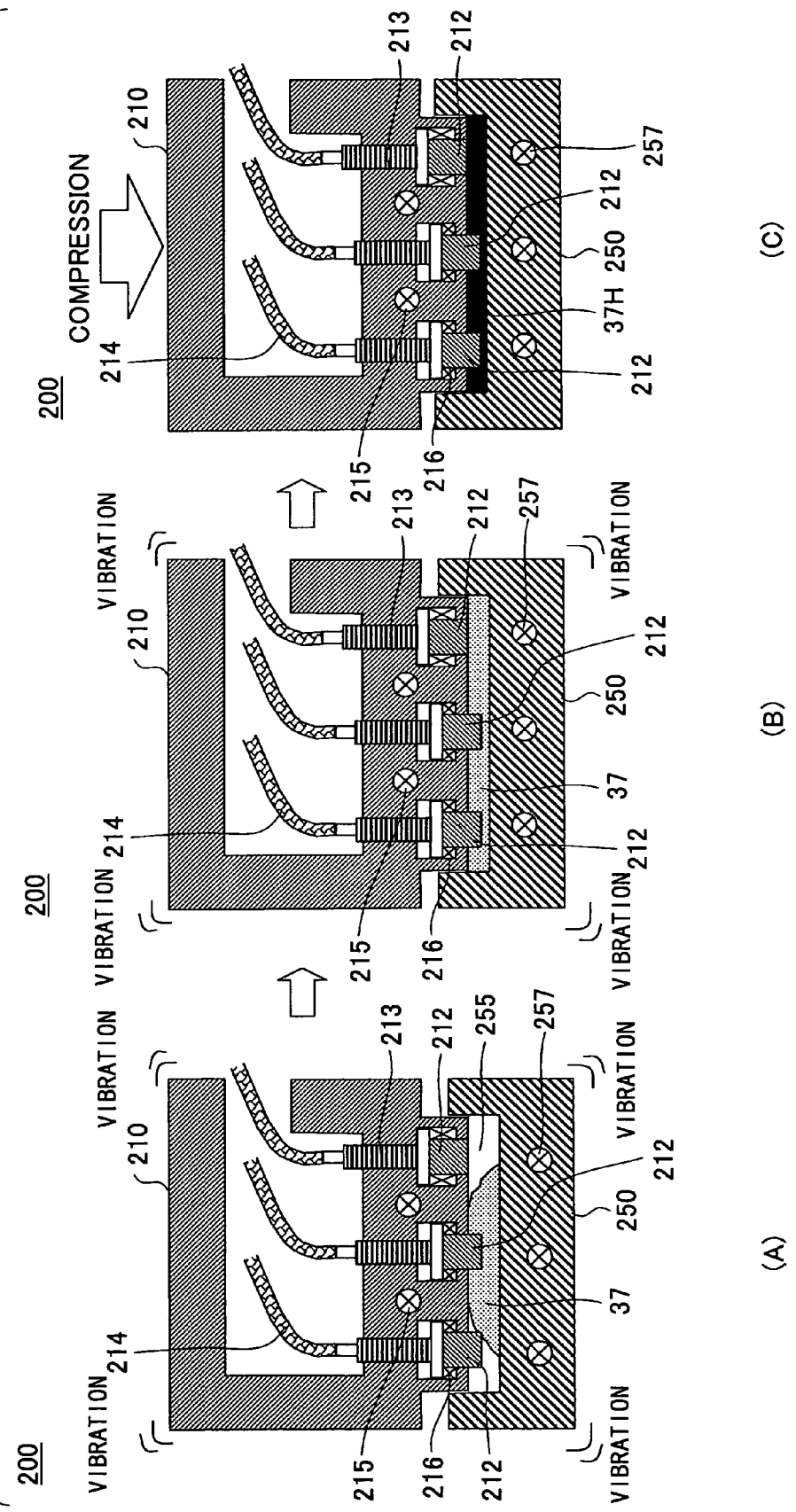
FIG. 29 is a view showing an operation of the sealing resin solidification apparatus of the fourth embodiment of the present invention.
Figure 30:
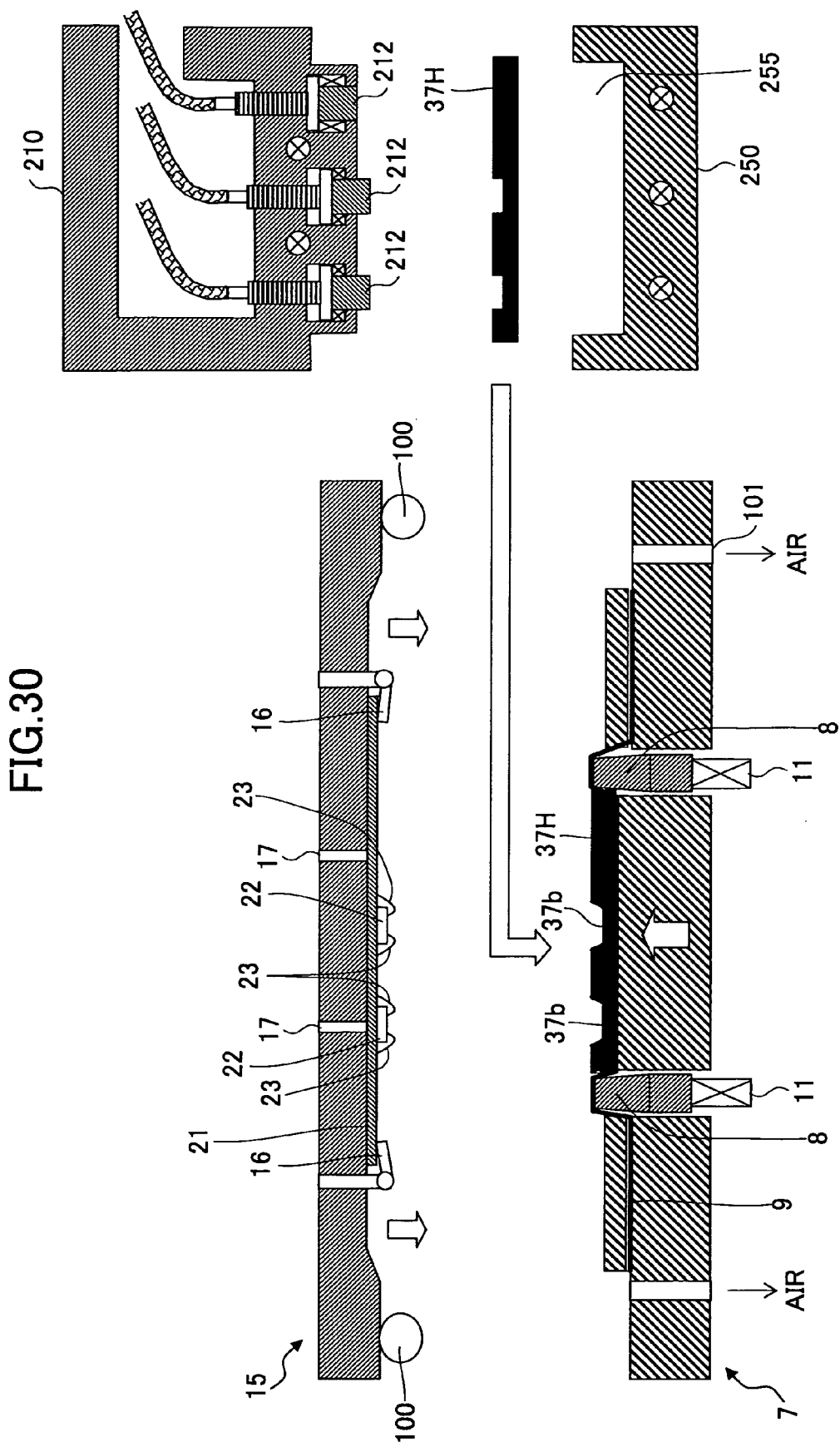
FIG. 30 is a view showing movement of sealing resin made solid by the sealing resin solidification apparatus of the fourth embodiment of the present invention to the lower mold.

In FIG. 28 through 30, parts that are the same as the parts discussed in the third embodiment are given the same reference numerals, and explanation thereof is omitted.

In the first through third embodiments, the powder or granular sealing resin is supplied from the sealing resin supply apparatus to the cavity forming part 10 of the lower mold.

In this embodiment, the powder or granular sealing resin is solidified in a configuration corresponding to the existence of the semiconductor element mounted on the wiring board to be sealed in advance, and then the solid sealing resin is arranged in the lower mold.

A structure of a sealing resin solidifying apparatus used in this embodiment is discussed with reference to FIG. 28.

A sealing resin solidifying apparatus 200 includes a projecting mold 210 and a receiving mold 250.

A sealing resin receiving part 255 is provided in the substantially center of the receiving mold 250. The sealing resin receiving part 255 has the substantially same volume and configuration of those of the cavity forming part 10 formed in the lower mold 7 used at the time of resin sealing.

A heater 257 is provided below the sealing resin receiving part 255 in the receiving mold 250. The heater 257 heats the sealing resin 37 received in the sealing resin receiving part 255 at approximately 25 through 50° C. that is a temperature at which a curing reaction is not promoted.

On the other hand, a projection part 212 having the substantially same volume of the semiconductor element mounted on the wiring board, as well as the projection part 52 of the third embodiment, is provided in the projecting mold 210. More specifically, the projection part 212 is provided at the lower part of the projecting mold 210 and in a position corresponding to the position of the semiconductor element mounted on the wiring board so as to be capable of moving in a vertical direction.

The projection part 212 is connected to a screw part 213 piercing and being capable of moving in the projecting mold 210. The screw part 213 is connected to an end part of a flexible cable 214. The other end part of the flexible cable 214 is connected to a motor (not shown). A rotational operation of the motor is transmitted to the screw part 213 by the flexible cable 214.

When the motor is driven so that the rotational operation is transmitted to the screw part 213 by the flexible cable 214, the screw part 213 is rotated so as to move downward. The projection part 212 connected to the screw part 213 moves in the projecting mold 210 and projects from the lower surface of the projecting mold 210 to an outside of the projecting mold 210.

In addition, the spring 216 is provided in the periphery of the projection part 212. In a state where the motor is not driven, the projection part 212 is pushed by the screw part 213 and the spring 216 so as to not project from the lower surface of the projecting mold 210 to the outside of the projecting mold 210.

The heater 215 is provided at a lower part of the projecting mold 210.

A resin sealing method using the sealing resin solidifying apparatus 200 is discussed with reference to FIG. 28 and FIG. 29.

In this embodiment, the sealing resin solidifying apparatus 200 is used so that the powder or granular sealing resin is solidified as corresponding to the existence of the semiconductor element mounted on the wiring board to be sealed.

As discussed in the third embodiment, the image recognition process against the wiring board to be sealed is implemented. The position information and the registration information are compared by the image recognition apparatus. The weight data of the sealing resin whose amount corresponds to the volumes of the semiconductor elements not mounted on the wiring board are added so as to be sent to the resin metering apparatus 80.

Based on the data, the weight of the sealing resin to be supplied to the sealing resin solidifying apparatus 200 is metered and the metered sealing resin is supplied to the sealing resin receiving part 255 of the receiving mold 250 of the sealing resin solidifying apparatus 200.

On the other hand, regarding the projecting mold 210, the position information recognized by the sensing part is sent to the sealing resin solidifying apparatus 200. Based on the position information, the projection part 212 provided in a position corresponding to the position of the semiconductor element projects if the corresponding semiconductor element is provided. The projection part 212 does not project if the corresponding semiconductor element is not provided.

In other words, the position information of the semiconductor element on the wiring board is made related to a control signal of the motor of the sealing resin supply apparatus 50, so that taking in and out of the projection part 212 of the projecting mold 210 is controlled by the corresponding motor.

A motor corresponding to the projection part 212 corresponding to the part where the semiconductor element is mounted on the wiring board is driven, so that the rotational operation is transmitted to the screw part 213. As a result of this, the projection part 212 connected to the screw part 213 projects from the lower surface of the projecting mold 210 to an outside of the projecting mold 210.

On the other hand, a motor corresponding to the projection part 212 corresponding to the part where a semiconductor element is not mounted on the wiring board is not driven, and therefore the screw part 213 is not rotated. In this case, the projection part 212 does not project from the lower surface of the projecting mold 210 to the outside of the projecting mold 210. A surface of the projection part 212 corresponding to this part forms the same surface as a lower surface of the projecting mold 210 facing the sealing resin receiving part 255.

In the example shown in FIG. 28, a projection part situated right-most among three projection parts 212 corresponds to the part where a semiconductor element is not provided and does not project from the lower surface of the projecting mold 210.

Next, as shown in FIG. 29, the projecting mold 210 is mounted on the receiving mold 250 as show in FIG. 29-(A). The molds 210 and 250 are vibrated so that the sealing resin received in the sealing resin receiving part 255 of the receiving mold 250 is dispersed as shown in FIG. 29-(B).

At this time, the receiving mold 250 is heated by the heater 257 so that the temperature of the sealing resin 37 received in the sealing resin receiving part 255 is approximately 25 through 50° C. that is a temperature at which curing reaction is not promoted. Hence, the sealing resin 37 does not become molten but does soften.

In addition, at this time, pressure is applied from an upper part of the projecting mold 210 as shown in FIG. 29-(C).

Since the sealing resin 37 is in a softening state, the resin 37 is easily solidified by this pressure. The solidified sealing resin 37H is shown in block color in FIG. 29-(C).

After that, as shown in FIG. 30, the solidified sealing resin 37H is picked up by an abruption part (not shown) such as mechanical arm so as to be taken out from the sealing resin receiving part 255 of the receiving mold 250 and be received in the cavity forming part 10 of the lower mold 7.

Here, since the sealing resin receiving part 255 of the receiving mold 250 has the same volume and configuration of those of the cavity forming part 10 formed in the lower mold 7, the sealing resin 37H taken out from the sealing resin receiving part 255 of the receiving mold 250 is received in the cavity forming part 10 of the lower mold 7 as it is.

In the sealing resin 37H received in the cavity forming part 10, the concave part 37b is formed in a position corresponding to the position of the semiconductor element 22 mounted on the wiring board 21, by the projection part 212 in the mold 210. On the other hand, the concave part 37B is not formed in a position corresponding to the position where a semiconductor element 22 is not provided.

Next, the upper mold 15 where the wiring board 21 is provided and the lower mold 17 heated at a constant temperature of approximately 175° C. are closed for resin sealing.

Thus, in this embodiment, after the powder or granular sealing resin is solidified in advance so as to correspond to the existence of the semiconductor element mounted on the sealed wiring board, the sealing resin is supplied to the lower mold.

Therefore, the sealing resin in the cavity forming part of the lower mold can be arranged and distributed securely as corresponding to the existence of the sealed semiconductor element. Therefore, it is possible to securely prevent the flow of the sealing resin.

Hence, deformation and/or breaking of a bonding wire due to a flow of sealing resin and contact of the bonding wire with another bonding wire can be prevented.

This embodiment is proper for resin sealing an electronic part by using sealing resin having a minimum melting viscosity of 200 poise.

In a case where the resin has such a minimum melting viscosity, even if the resin solidified by the sealing resin solidifying apparatus is provided in the cavity forming part of the lower mold heated at approximately 175° C., it is possible to prevent the sealing resin from flowing and to prevent the deformation of the concave part.

Fifth Embodiment

A method of resin sealing an electronic part of a fifth embodiment of the present invention is discussed with reference to FIG. 31 through FIG. 34.

In FIG. 31 through 34, parts that are the same as the parts discussed in the third embodiment are given the same reference numerals, and explanation thereof is omitted.

This embodiment is proper for resin sealing an electronic part by using sealing resin having a minimum melting viscosity of 200 poise.

However, in a case where the sealing resin has a minimum melting viscosity equal to or smaller than 50 poise, it is difficult to solidify the powder or granular sealing resin in advance by the sealing resin solidifying apparatus whereby the resin would have a configuration corresponding to the existence of the sealed semiconductor element and the solidified resin would be received in the lower mold.

That is, if the sealing resin is received in the cavity forming part of the lower mold heated in advance, melting and flowing of the sealing resin is generated at the same time so that deformation and/or breaking of the bonding wire due to a flow of the sealing resin may happen and a short circuit with another bonding wire may be generated.

In this embodiment, a projection part which can be taken in and out of the cavity forming part is provided at a position of a bottom of the cavity forming part of the lower mold corresponding to the position of the semiconductor element mounted on the wiring board so that the above-mentioned problem can be solved.

Next, a structure of the lower mold in this embodiment is discussed with reference to FIG. 31.

The cavity forming part 10 is formed in the center of the upper surface of the lower mold 300. The cavity forming part 10 is surrounded by the frame part 8 elastically supported by the spring 11. In addition, the release film 9 made of, for example, fluoride group resin, covers the bottom part of the cavity forming part 10 and the surface of the frame part 8.

Guide sticks 302 are provided outside of the frame parts 8. The guide part 302 pierces a support frame body 320 of the lower mold 300 and can move in upper and lower directions in the support frame body 320.

A head end of the guide stick 302 projects from the support frame body 320 and is positioned at a lightly lower position than a head end of the frame part 8.

A lower end of the guide stick 302 is supported by a receiving stand 304 provided inside of the support frame body 320. End parts of the receiving stand 304 are supported by a bottom part of the support frame body 320 via a spring 306.

Discharge holes 101 are provided in the support frame body 320. More specifically, the discharge holes 320 are positioned outside of the guide stick 302. A closed space formed by the upper mold 15, the lower mold 300 and the packing 100 has air discharged via the discharge hole 101 when the upper mold 15 and the lower mold 300 come in contact with each other via the elastic packing 100.

A support part 330 of the cavity forming part 10 is provided at the lower part of the cavity forming part 10.

Projection parts 308 are provided at positions corresponding to the position of the semiconductor elements 22 mounted on the wiring board 21, inside of the support part 330 of the cavity forming part 10. The projection part 308 pierces the cavity support part 330 and can push up the release film 9 into the cavity forming part 10 so as to project.

The lower end of the projection part 308 is connected to the piston 314. The piston 314 is provided in the air cylinder 310 provided in the receiving stand 304, via the spring 312. The piston 314 pierces the receiving stand 304 and can move in upper and lower direction.

Air inflow tube 316 is connected to the air cylinder 310. The other end of the air inflow tube 316 is connected to an electromagnetic valve (not shown). By opening the electromagnetic valve, compressed air flows into the air cylinder 310 via the air inflow tube 316. As a result of this, the piston 314 provided in the air cylinder 310 moves upward. The projection part 308 connected to the piston 314 moves in the cavity support part 330, pushes the release film 9 from the lower surface of the cavity forming part 10, and projects into the cavity forming part 10.

In a state where the compressed air is not flowing into the air cylinder 310 via the air inflow tube 316, the projection part 308 is pushed to a side of the air cylinder 310 by the spring 312. Hence, the projection part 308 does not push the release film 9 from the lower surface of the cavity forming part 10 and does not project into the cavity forming part 10.

In a case where the electromagnetic valve is closed, the compressed air does not flow into the air cylinder 310. Hence, the piston 314 does not move in the air cylinder 310 and the projection part 308 does not project into the cavity forming part 10.

A resin sealing method using the lower mold 300 having the above-discussed structure is discussed with reference to FIG. 32. Here, FIG. 32 is a flowchart showing a flow of the resin sealing process using the lower mold 300 shown in FIG. 31.

As discussed in the third embodiment, first, an image recognition process of the wiring board which wiring board is a subject of a resin sealing process is implemented by the image recognition apparatus (not shown).

In the support part 330 of the cavity forming part 10, based on the position information recognized by a sensing part (camera 71), the projection part 308 provided in a position corresponding to the position of the semiconductor element mounted on the wiring board is controlled. That is, if the corresponding semiconductor element exists, the projection part 308 is made to push the release film 9 from the lower surface of the cavity forming part 10 to the cavity forming part 10 so as to be made to project. If the corresponding semiconductor element does not exist, the projection part 308 is not made to project in step S1.

In other words, the position information of the semiconductor element on the wiring board is made related to a control signal of the electromagnetic valve, so that taking in and out of the projection part 308 is controlled via the air cylinder 310 by controlling the corresponding electromagnetic valve.

The electromagnetic valve corresponding to the part of the wiring board where the semiconductor element is mounted is opened so that the compressed air flows into the air cylinder 310 and the piston 314 moves upward. As a result of this, the projection part 308 connected to the piston 314 is made to push the release film 9 from the bottom surface of the cavity forming part 10 and project into the cavity forming part 10.

On the other hand, the electromagnetic valve corresponding to the part where a semiconductor element is not mounted is not opened so that the compressed air does not flow in the air cylinder 310. As a result of this, the projection part 308 corresponding to this part does not project from the bottom surface of the cavity forming part 10 into the cavity forming part 10. A surface of the projection part corresponding to this part forms the same surface as the bottom of the cavity forming part 10, namely the bottom surface of the sealing resin receiving part 36.

Figure 31:
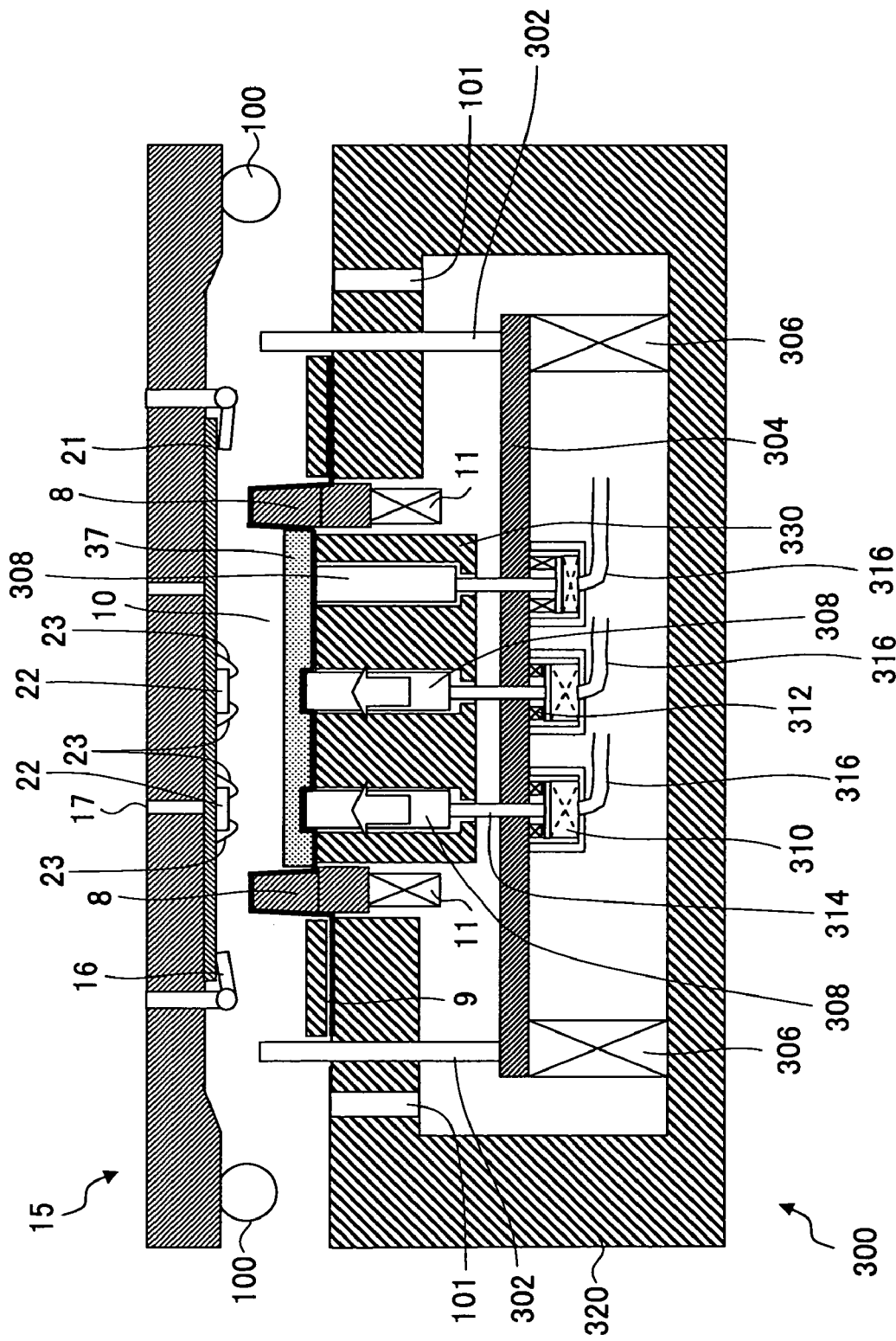
FIG. 31 is a view showing a structure of a lower mold of a fifth embodiment of the present invention.
Figure 32:
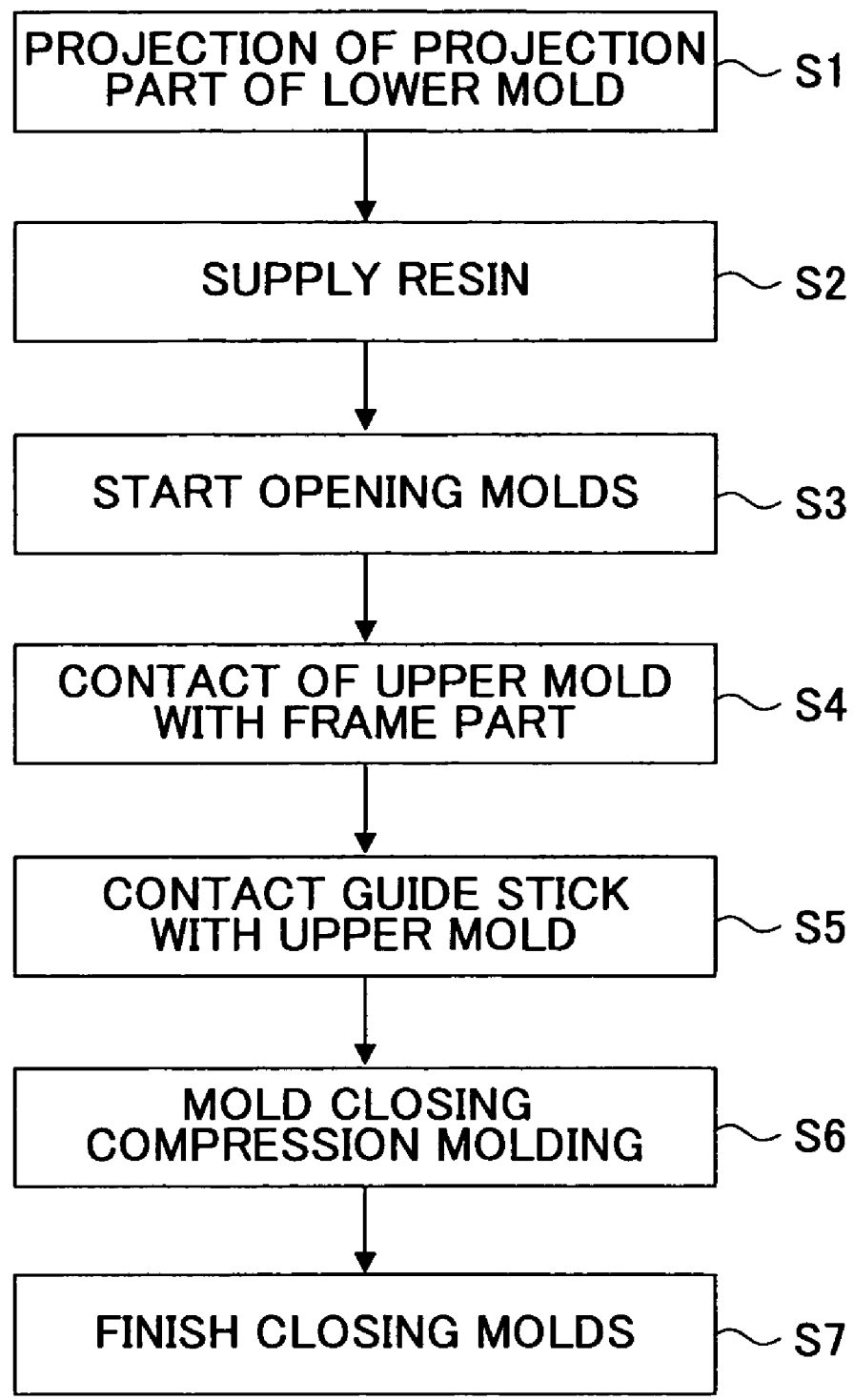
FIG. 32 is a flowchart showing a flow of the resin sealing process using the lower mold shown in FIG. 31.
Figure 33:
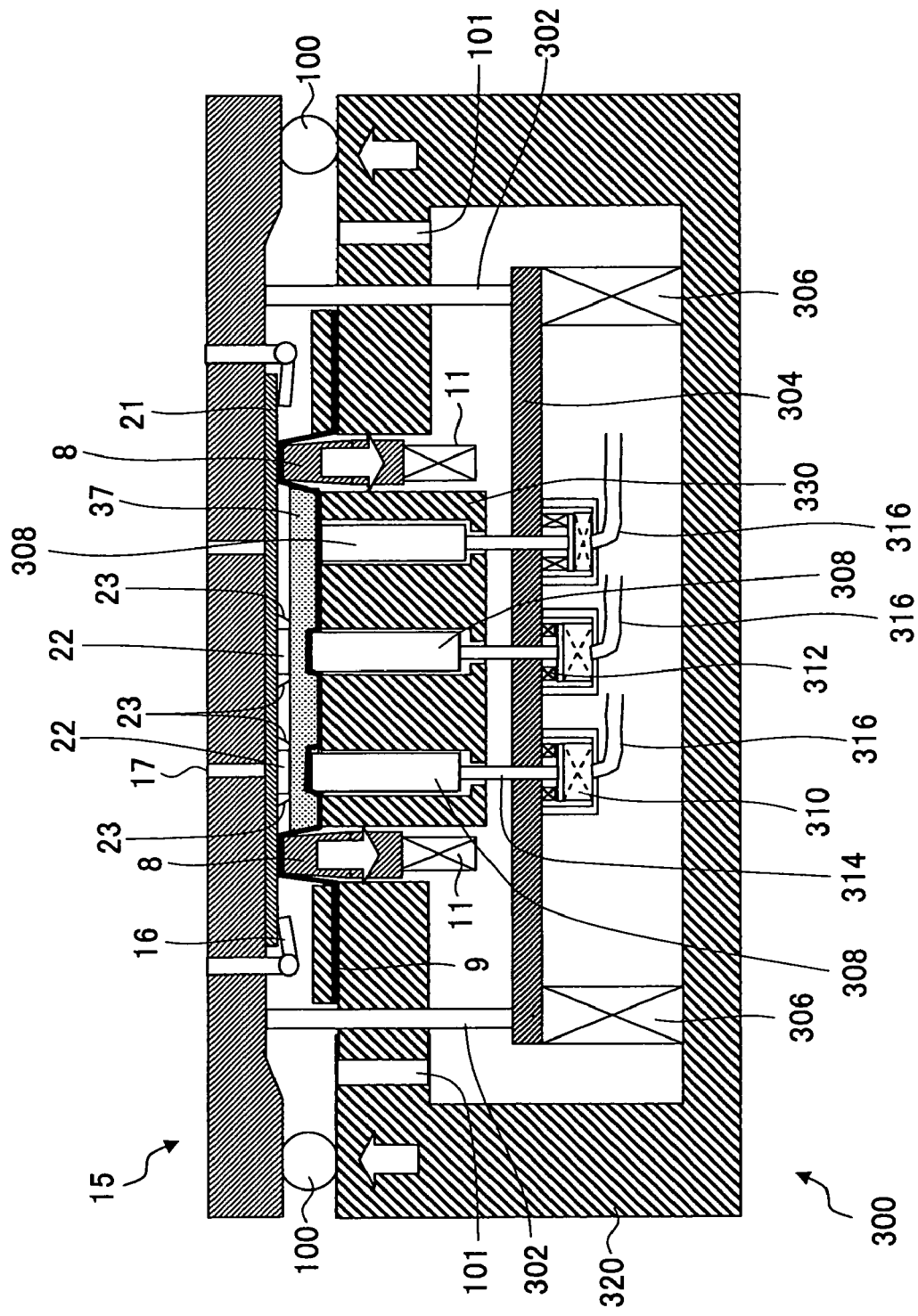
FIG. 33 is a first view showing working of the lower mold of the fifth embodiment of the present invention.

In the examples shown in FIG. 31 and FIG. 33, a projection part situated right-most among three projection parts 308 corresponds to the part where a semiconductor element is not provided and does not push the release film 9 from the bottom surface of the cavity forming part 10 and does not project into the cavity forming part 10.

The position information and the registration information are compared. Data of the weight of the sealing resin corresponding to the volumes of semiconductor elements not mounted on the wiring board are sent to a resin metering apparatus. Based on the data, the amount of the sealing resin to be supplied to the lower mold 300 is added so that the resin is supplied to the cavity forming part 10 of the lower mold 300 in step S2.

A state where the process of step S2 is completed is shown in FIG. 31. As shown in FIG. 31, in this embodiment, in a case where the sealing resin has a high flowing property such as a minimum melting viscosity equal to or smaller than 50 poise, if the sealing resin is supplied to the cavity forming part 10 of the lower mold 300, the sealing resin easily flows to the outside of the projection part 308 and its surface becomes flat.

Next, the lower mold 300 is raised so as to approach the upper mold 15 and mold closing is started in step S3.

First, a ring shaped packing 100 provided on the lower surface of the upper mold 15 comes in contact with the upper surface of the lower mold 300. A closed space is formed by the upper mold 15, the lower mold 300 and the packing 100. In this stage, the closed space is discharged via the discharge hole 101 so as to have a vacuum degree necessary for resin sealing. In other words, in order to prevent generation of void in the resin sealing part, a space for resin sealing including the cavity forming part 10 has a designated vacuum degree.

Next, the frame part 8 of the lower mold 300 comes in contact with the upper mold 15 so that the frame part 8 defines an area being resin sealed in step S4.

When the lower mold 300 is further raised, the frame part 8 is lowered against the spring 11 provided in the bottom part of the frame part 8. The frame part 8 goes down until mold closing is completed.

The semiconductor elements 22 mounted on and fixed to the wiring board 21 come in contact with the surface of the sealing resin 37 and the guide stick 302 at the lower mold 300 comes in contact with upper mold 15 in step S5. This state is shown in FIG. 33.

The lower mold 300 is further raised so that compression molding by mold closing proceeds in step S6. As a result of this, since the guide stick 302 is elastically supported via the receiving stand 304 by the spring 306, the guide stick 302 pushed by the upper mold 15 is lowered together with the receiving stand 304.

As the receiving stand 304 is lowered, the projection part 308 supported by the receiving stand 304 is also lowered. As the projection part 308 is lowered, the sealing resin 37 positioned on the projection part 308 is lowered into the cavity forming part 10.

As a result of this, the sealing resin 37 corresponding to the part where the semiconductor element 22 is positioned comes in contact with the semiconductor element 22 without pressing and contacting the upper surface of the semiconductor element 22, receives the semiconductor element 22, and covers the surface and side surface part of the semiconductor element 22.

Therefore, the semiconductor element 22 is pressed not in the sealing resin 37 and therefore it is possible to prevent the flow of the sealing resin 37. Because of this, deformation and/or breaking of the bonding wire due to the flow of the sealing resin 37 and the contact of the bonding wire 23 with another bonding wire can be prevented.

Figure 34:
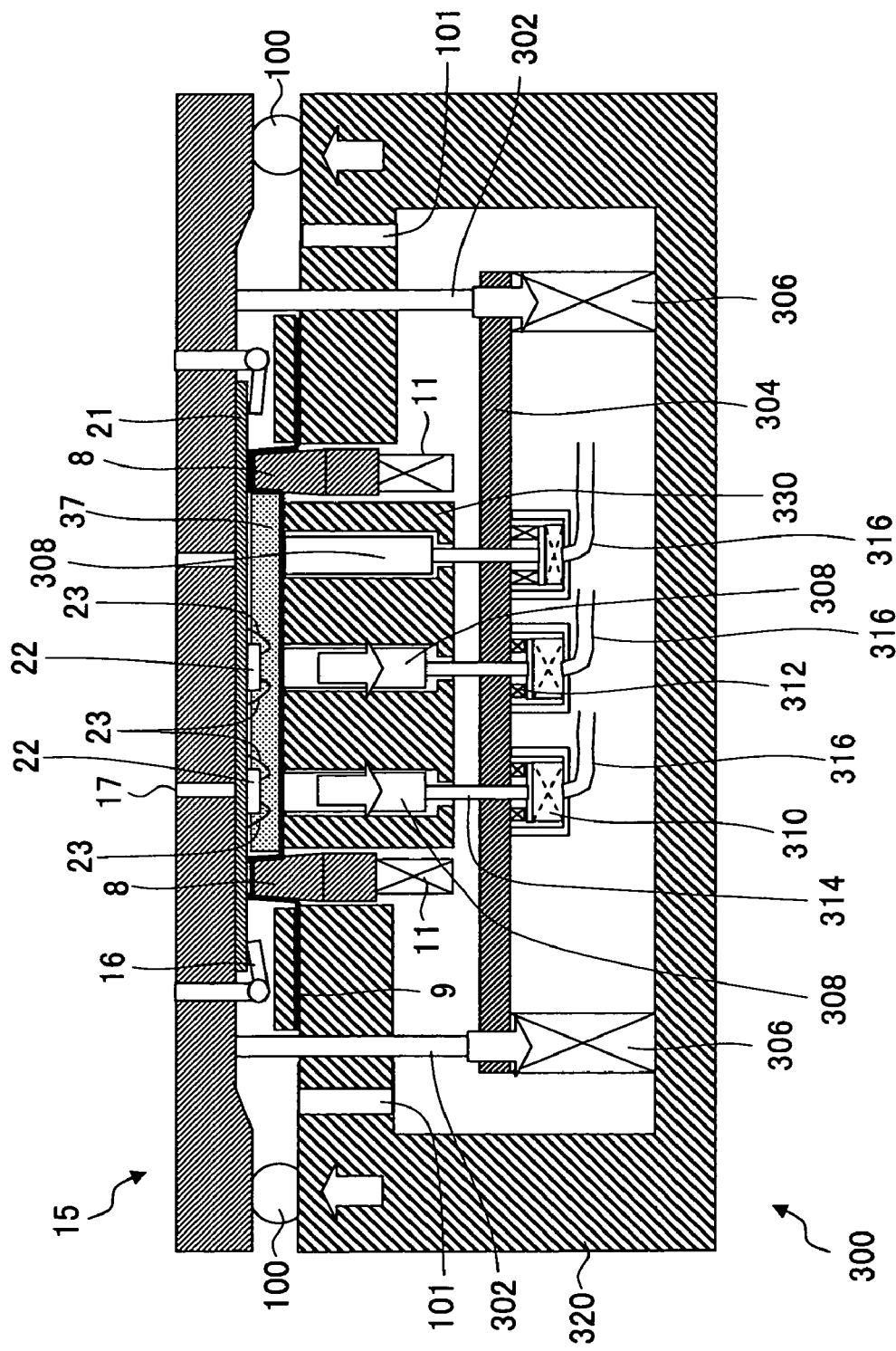
FIG. 34 is a second view showing working of the lower mold of the fifth embodiment of the present invention.

When the projection part 308 is further lowered so that, as shown in FIG. 34, the upper surface of the projection part 308 and the bottom of the cavity forming part 10 meet and the bottom of the cavity forming part 10 is flat, the mold closing is finished in step S7. After that, the lower mold 300 is lowered.

Thus, in this embodiment, even if the sealing resin having a high flowing property and a minimum melting viscosity equal to or smaller than approximately 50 poise is used, the projection part is provided in the cavity forming part of the lower mold as corresponding to the position of the semiconductor element mounted on the wiring board to be sealed. The projection part is made to project into the cavity forming part before mold closing is started. The projection part is taken in, in connection with the mold closing of the upper mold and lower mold so that the semiconductor element is received in the sealing resin.

Therefore, unnecessary flow of the sealing resin is not generated even if the sealing resin has a high flowing property. Hence, deformation and/or breaking of the bonding wire due to the flow of the sealing resin and the contact of the bonding wire with another bonding wire can be prevented.

[Manufacturing Method of Semiconductor Device]

Next, an example of a manufacturing method of a semiconductor device using the resin sealing method of the present invention is discussed with reference to FIG. 35.

Figure 35:
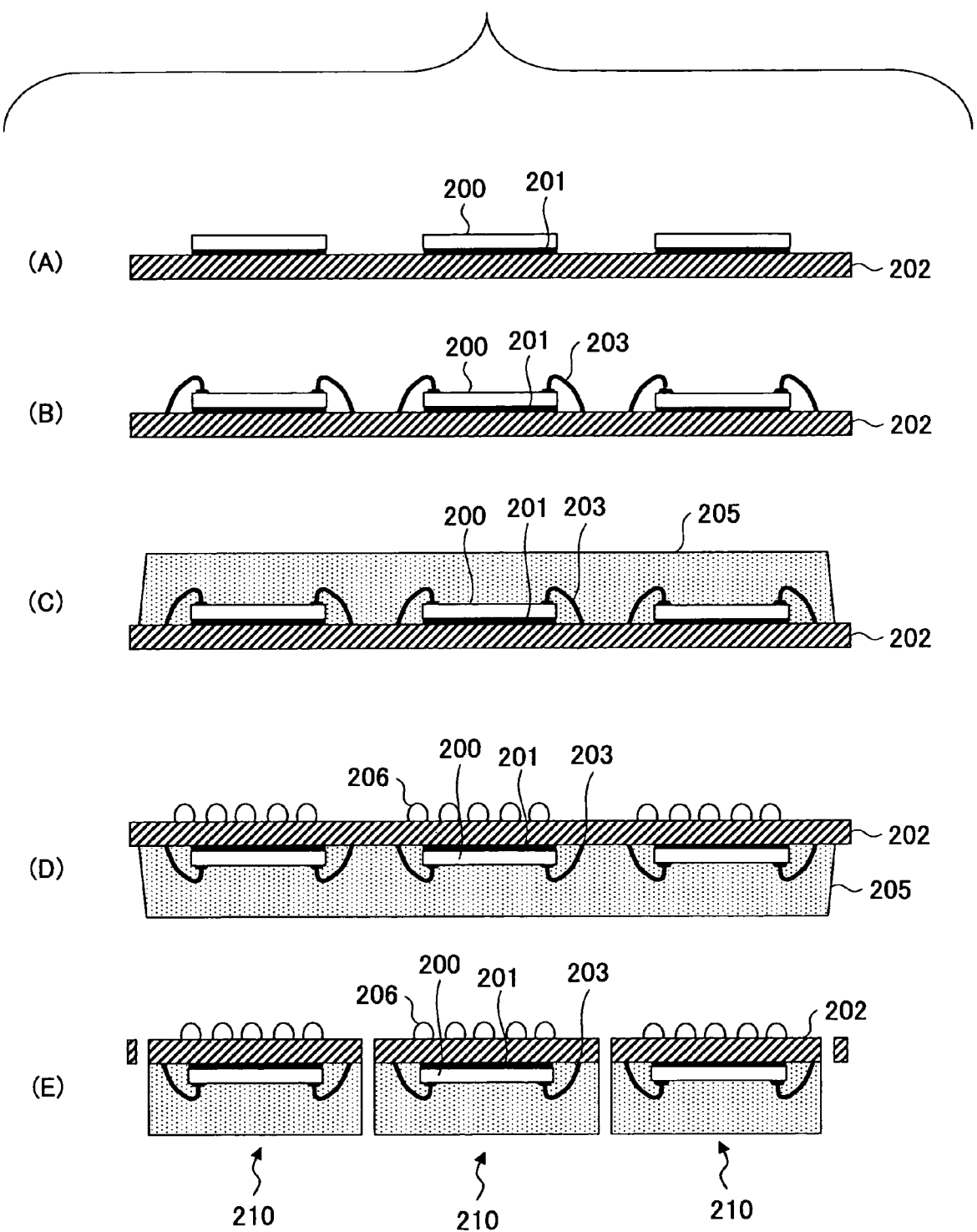
FIG. 35 is a view showing an example of a manufacturing method of a semiconductor device using the resin sealing method of the present invention.

In a manufacturing process shown in FIG. 35, a large size wiring board is used and plural semiconductor devices are mounted on the wiring board. After resin sealing, it is divided so that individual semiconductor devices are formed.

In FIG. 35, three semiconductor devices formed on the large-seized wiring board are shown as an example.

First, as shown in FIG. 35-(A), the semiconductor element 200 having a rear surface where a die bonding film 201 is adhered but on which rear surface 201 neither an electronic circuit element nor an electronic circuit is formed is mounted on and fixed to the wiring board 202 via the bonding film 201.

Next, as shown in FIG. 35-(B), the outside connection terminal of the semiconductor element 200 and an electrode terminal (not shown) on the wiring board 202 are connected by using the bonding wire 203.

Then, as shown in FIG. 35-(C), by applying the resin sealing method of the present invention, the semiconductor element 200 mounted on and fixed to the wiring board 202 and the bonding wire 203 are resin sealed by the sealing resin 205 in a lump (one operation).

At this time, by using the resin sealing method of the present invention, deformation and/or breaking of a bonding wire 203 due to flow of sealing resin 205 and contact of the bonding wire with another bonding wire can be prevented.

Next, as shown in FIG. 35-(D), plural outside connection terminals 206 made of solder balls are arranged on other main surface of the wiring board 202.

After that, as shown in FIG. 35-(E), dicing wherein a dicing saw is used is implemented where the wiring board 202, the semiconductor elements 202 provided on the main surface of the wiring board 202 and sealed by the sealing resin 205, and the bonding wire 203 led from the semiconductor element 202 are regarded as one unit, so that individual semiconductor devices 210 are formed.

The present invention is not limited to these embodiments, but variations and modifications may be made without departing from the scope of the present invention.

In the following claims, an example of a "resin material" is the sealing resin discussed above. An example of a "resin material supply apparatus" is the sealing resin supply apparatus discussed above. An example of a "pressing part" is the lid member discussed above. An example of a "registration part" is the database discussed above.

This patent application is based on Japanese Priority Patent Application No. 2006-41026 filed on Feb. 17, 2006, the entire contents of which are hereby incorporated by reference.

What is claimed is:

1. A method of resin sealing an electronic part using a first and second mold, the first mold having a cavity forming part, comprising:

pressurizing and dispersing a resin material in a sealing resin supply apparatus;

falling the resin material into the cavity forming part while the resin material has uniform distribution;

receiving the resin material in the cavity forming part of the first mold after the resin material is pressurized and dispersed;

providing a board where one or more of the electronic parts are mounted in the second mold;

melting the resin material received in the cavity forming part of the first mold; and inserting the electronic part into the molten resin so that the resin sealing is achieved.

2. The method of resin sealing the electronic part as claimed in claim 1, wherein the pressurizing applies pressure to the resin material using a lid member of the sealing resin supply apparatus.

3. The method of resin sealing the electronic part as claimed in claim 1, wherein the dispersing disperses the resin material in the sealing resin supply apparatus by vibrating the sealing resin supply apparatus.

4. The method of resin sealing the electronic part as claimed in claim 1, wherein the first mold is arranged below the sealing resin supply apparatus, the pressurized and dispersed sealing resin falls from an inside of the sealing resin supply apparatus, and the receiving receives the falling sealing resin in the cavity forming part of the first mold.

5. The method of resin sealing the electronic part as claimed in claim 1, wherein projection parts having volumes the same as volumes of the electronic parts are provided in positions as corresponding to mounting positions of the electronic parts mounted on the board.

6. The method of resin sealing the electronic part as claimed in claim 1, wherein projection parts having volumes the same as volumes of the electronic parts are provided so as to be capable of selectively projecting as corresponding to the existence of the electronic part.

7. The method of resin sealing the electronic part as claimed in claim 6, wherein the projection part is made to project against a part where the electronic part is mounted on the board; and the projection part is made not to project against a part where the electronic part is not mounted on the board.

8. The method of resin sealing the electronic part as claimed in claim 1, wherein an amount of the resin material corresponding to a volume of an electronic part not mounted on the board is added to an amount of the resin material when all of the electronic parts to be mounted are mounted on the board, so that the resin material is received in the sealing resin supply apparatus.

9. The method of resin sealing the electronic part as claimed in claim 8,
wherein a weight of the amount of the resin material corresponding to the volume of the electronic part not actually mounted on the board is calculated, based on information with respect to a weight of the resin material corresponding to a volume of a single electronic part, the information being registered in a registration part, and information with respect to the number of the electronic parts not actually mounted on the board.

10. The method of resin sealing the electronic part as claimed in claim 1, wherein the resin material is at least one of a powder and granular state material.

* * * * *